US012666665B2

(12) United States Patent
Gardner et al.

(10) Patent No.: US 12,666,665 B2
(45) Date of Patent: Jun. 23, 2026

(54) METHOD OF 3D EPITAXIAL GROWTH FOR HIGH DENSITY 3D HORIZONTAL NANOSHEETS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 899 days.

(21) Appl. No.: 17/742,107

(22) Filed: May 11, 2022

(65) Prior Publication Data

US 2023/0024788 A1     Jan. 26, 2023

Related U.S. Application Data

(60) Provisional application No. 63/222,282, filed on Jul. 15, 2021.

(51) Int. Cl.
| | |
|---|---|
| *H10D 62/10* | (2025.01) |
| *H10D 30/01* | (2025.01) |
| *H10D 30/67* | (2025.01) |
| *H10D 84/01* | (2026.01) |
| *H10D 84/03* | (2025.01) |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 84/0128* (2025.01); *H10D 84/013* (2025.01); *H10D 84/038* (2025.01)

(58) Field of Classification Search
CPC ............. H10D 62/118; H10D 30/6757; H10D 84/013; H10D 30/6713
See application file for complete search history.

(56) References Cited

U.S. PATENT DOCUMENTS

2019/0035888 A1* 1/2019 Wu ................... H01L 21/02483

* cited by examiner

*Primary Examiner* — Christopher A Culbert
(74) *Attorney, Agent, or Firm* — Oblon, McClelland, Maier & Neustadt, L.L.P.

(57) ABSTRACT

Techniques herein include methods of forming channel structures for field effect transistors having a channel current path parallel to a surface of a substrate. 3D in-situ horizontal or lateral growth of the channel and source/drain regions allows for a custom doping in the 3D horizontal nanosheet direction for NMOS and PMOS devices. An ultra-short channel length is achieved with techniques herein because the channel is epitaxially grown in the 3D horizontal nanosheet direction at the monolayer level. Since the channel is grown in a dielectric cavity, a precise channel cross sectional area can be tuned.

10 Claims, 22 Drawing Sheets

| | 199 | | 110 | | 120 |
|---|---|---|---|---|---|
| | 180 | | 185 | | 160 |

X ←——————————————————————————→ X'

PR MASK    PR MASK

| | 199 | | 110 | | 120 |
|---|---|---|---|---|---|
| | 180 | | 185 | | 130 |

| | | | | | |
|---|---|---|---|---|---|
| 150 | | 199 | | 110 | |
| 120 | | 185 | | 130 | |
| 140 | | 190 | | | |

| | | | | | |
|---|---|---|---|---|---|
| 150 | | 199 | | 110 | |
| 120 | | 185 | | 130 | |
| 140 | | 190 | | 197 | |

196a

196a

105

| | | |
|---|---|---|
| 150 | 199 | 110 |
| 120 | 185 | 130 |
| 140 | 197 | 190 |
| 191 | | |

| | | |
|---|---|---|
| 150 | 199 | 110 |
| 120 | 185 | 130 |
| 140 | 197 | 190 |

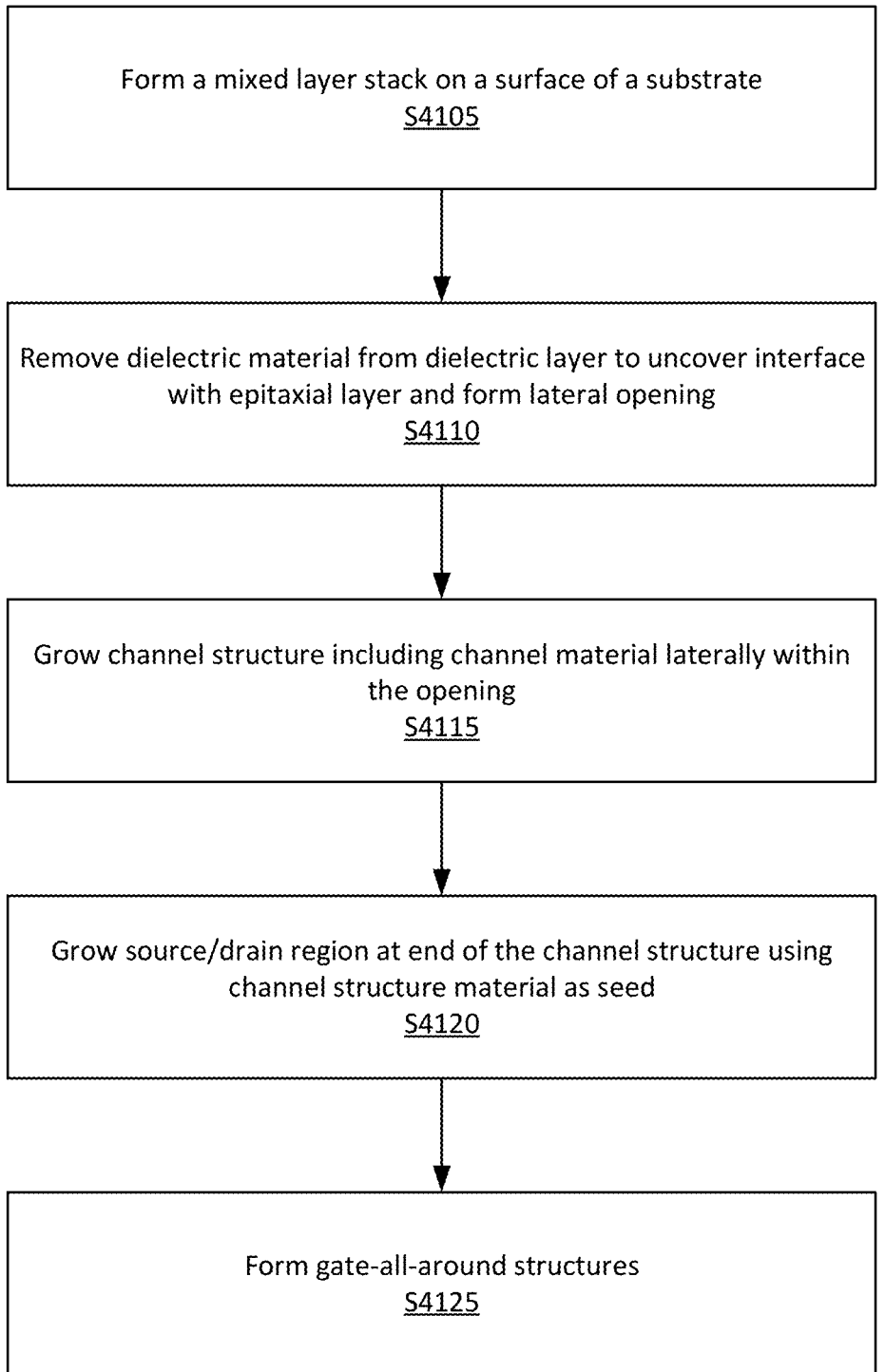

Form a mixed layer stack on a surface of a substrate
S4105

Remove dielectric material from dielectric layer to uncover interface with epitaxial layer and form lateral opening
S4110

Grow channel structure including channel material laterally within the opening
S4115

Grow source/drain region at end of the channel structure using channel structure material as seed
S4120

Form gate-all-around structures
S4125

FIG. 41

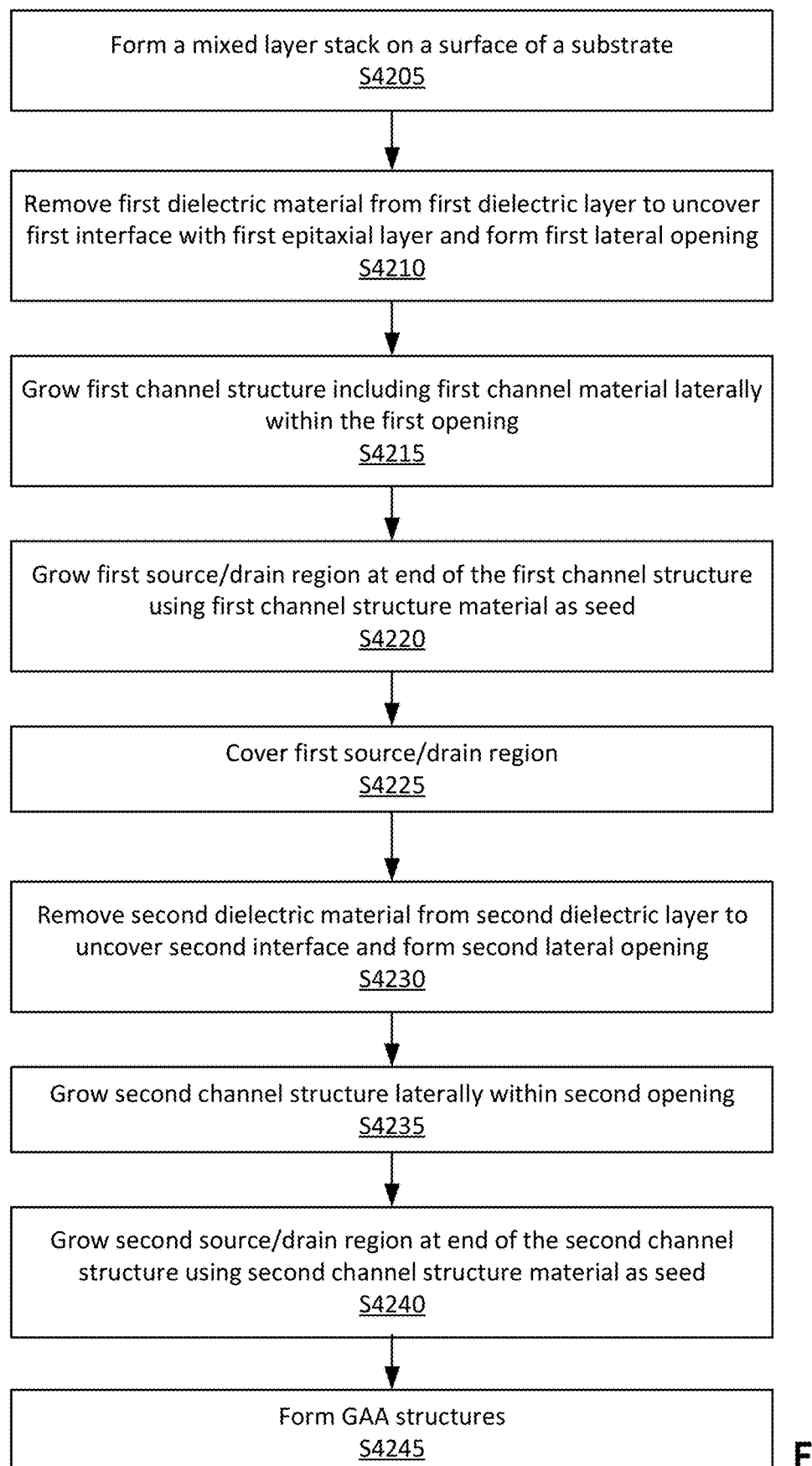

Form a mixed layer stack on a surface of a substrate
S4205

Remove first dielectric material from first dielectric layer to uncover first interface with first epitaxial layer and form first lateral opening
S4210

Grow first channel structure including first channel material laterally within the first opening
S4215

Grow first source/drain region at end of the first channel structure using first channel structure material as seed
S4220

Cover first source/drain region
S4225

Remove second dielectric material from second dielectric layer to uncover second interface and form second lateral opening
S4230

Grow second channel structure laterally within second opening
S4235

Grow second source/drain region at end of the second channel structure using second channel structure material as seed
S4240

Form GAA structures
S4245

FIG. 42

METHOD OF 3D EPITAXIAL GROWTH FOR HIGH DENSITY 3D HORIZONTAL NANOSHEETS

CROSS REFERENCE TO RELATED APPLICATIONS

This present disclosure claims the benefit of U.S. Provisional Application No. 63/222,282, filed on Jul. 15, 2021, which is incorporated herein by reference in its entirety.

FIELD OF THE INVENTION

The present disclosure relates to a method of semiconductor fabrication, and particularly to epitaxial growth along a lateral direction to form horizontal nanosheets.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e., the vertical stacking of multiple devices, aims to overcome these scaling limitations by increasing transistor density in volume rather than area. Although device stacking has been successfully demonstrated and implemented by the flash memory industry with the adoption of 3D NAND, application to random logic designs is more difficult. Thus, 3D integration for logic chips (e.g. CPU (central processing unit), GPU (graphics processing unit), FPGA (field programmable gate array), and SoC (system on a chip)) is desired.

SUMMARY

The present disclosure relates to a method of fabricating a semiconductor device, including forming a mixed layer stack on a surface of a substrate including a semiconductor material, the mixed layer stack including a multilayer dielectric layer stack surrounding a multilayer epitaxial layer stack, the multilayer dielectric layer stack including a plurality of alternating dielectric layers alternating in a direction perpendicular to a plane of the surface of the substrate, the plurality of dielectric layers having at least two different dielectric materials having different etch selectivities to one another, a first dielectric layer of the plurality of dielectric layers comprising a first dielectric material of the at least two different dielectric materials, the first dielectric layer of the plurality of dielectric layers having a thickness corresponding to a first channel thickness, and the multilayer epitaxial layer stack surrounded by the multilayer dielectric layer stack on the surface of the substrate, the multilayer epitaxial layer stack including a plurality of alternating epitaxial layers alternating in a direction perpendicular to a plane of the surface of the substrate, the plurality of epitaxial layers having at least two different epitaxial materials having different etch selectivities to one another, a first epitaxial layer of the plurality of epitaxial layers comprising a first epitaxial material of the at least two different epitaxial materials, the first dielectric layer of the plurality of dielectric layers being substantially aligned with and forming an interface with the first epitaxial layer of the plurality of epitaxial layers along a direction parallel to the plane of the surface of the substrate; removing the first dielectric material from the first dielectric layer to uncover the interface with the first epitaxial layer and forming an opening in the multilayer dielectric layer stack, a direction of the opening being parallel with the surface of the substrate; growing a channel structure including a channel material within the opening via epitaxial growth using the uncovered interface with the first epitaxial layer and the first epitaxial material as a seed material, the first epitaxial layer and the first epitaxial material at the interface comprising a first source/drain region; and growing, at an end of the channel structure opposite the first source/drain region and the interface, a second source/drain region via epitaxial growth using the end of the channel structure as the seed material.

The present disclosure additionally relates to a method of fabricating a semiconductor device, including forming a mixed layer stack on a surface of a substrate including a semiconductor material, the mixed layer stack including a multilayer dielectric layer stack surrounding a multilayer epitaxial layer stack, the multilayer dielectric layer stack including a plurality of alternating dielectric layers alternating in a direction perpendicular to a plane of the surface of the substrate, the plurality of dielectric layers having at least three different dielectric materials having different etch selectivities to one another, a first dielectric layer of the plurality of dielectric layers comprising a first dielectric material of the at least three different dielectric materials, the first dielectric layer of the plurality of dielectric layers having a thickness corresponding to a first channel thickness, a second dielectric layer of the plurality of dielectric layers comprising a second dielectric material of the at least three different dielectric materials, the second dielectric layer of the plurality of dielectric layers having a thickness corresponding to a second channel thickness, and the multilayer epitaxial layer stack surrounded by the multilayer dielectric layer stack on the surface of the substrate, the multilayer epitaxial layer stack including a plurality of alternating epitaxial layers alternating in a direction perpendicular to a plane of the surface of the substrate, the plurality of epitaxial layers having at least three different epitaxial materials having different etch selectivities to one another, a first epitaxial layer of the plurality of epitaxial layers comprising a first epitaxial material of the at least three different epitaxial materials, a second epitaxial layer of the plurality of epitaxial layers comprising a second epitaxial material of the at least three different epitaxial materials, the first dielectric layer of the plurality of dielectric layers being substantially aligned with and forming a first interface with the first epitaxial layer of the plurality of epitaxial layers along a direction parallel to the plane of the surface of the substrate, and the second dielectric layer of the plurality of dielectric layers being substantially aligned with and forming a second interface with the second epitaxial layer of the plurality of epitaxial layers along the direction parallel to the plane of the surface of the substrate; removing the first dielectric material from the first dielectric layer to uncover the first interface with the first epitaxial layer and forming a first opening in the multilayer dielectric layer stack, a direction of the first opening being parallel with the surface of the substrate; growing a first channel structure including a first channel material within the first opening via epitaxial growth using the uncovered first interface with the first epitaxial layer and the first epitaxial material as a seed material, the first epitaxial layer and the first epitaxial material at the first interface comprising a first source/drain region; growing, at an end of the first channel structure opposite the first source/drain region and the first interface, a second source/drain region via epitaxial growth using the end of the first channel structure as the seed material; covering the second source/drain region; removing the second dielectric material from the second dielectric layer to uncover the second interface with the second epitaxial layer and forming a second opening in the multilayer dielectric layer stack, a direction of the second opening being parallel with the surface of the substrate; growing a second channel structure including a second channel material within the second opening via epitaxial growth using the uncovered second interface with the second epitaxial layer and the second epitaxial material as the seed material, the second epitaxial layer and the second epitaxial material at the first interface comprising a third source/drain region; and growing, at an end of the second channel structure opposite the third source/drain region and the second interface, a fourth source/drain region via epitaxial growth using the end of the second channel structure as the seed material.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 3 is a cross-sectional substrate segment illustrating further definition of the epitaxial layer stack, according to an embodiment of the present disclosure.

FIG. 4 is a cross-sectional substrate segment illustrating a fill, according to an embodiment of the present disclosure.

FIG. 37 is a cross-sectional substrate segment illustrating drain region formation, according to an embodiment of the present disclosure.

FIG. 38 is a cross-sectional substrate segment illustrating dielectric fill, according to an embodiment of the present disclosure.

FIG. 41 is a flow chart for a method of fabricating a semiconductor device, according to an embodiment of the present disclosure.

FIG. 42 is a flow chart for a method 4200 of fabricating a semiconductor device, according to an embodiment of the present disclosure.

DETAILED DESCRIPTION

Figures 1, 2:
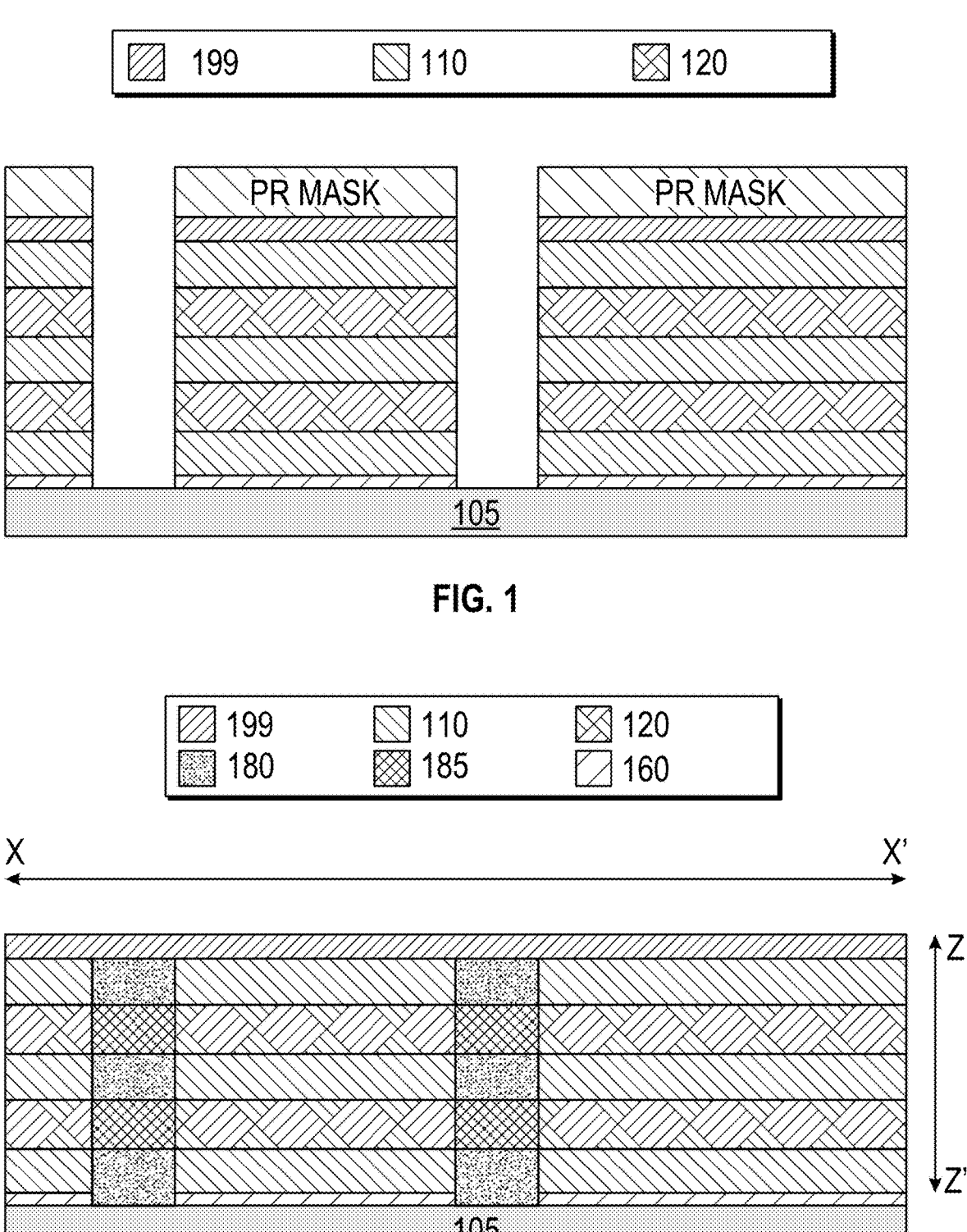
FIG. 1 is a cross-sectional substrate segment illustrating a dielectric layer stack of alternating dielectric layers grown with two or more dielectric layers, each dielectric being selected to be etch selective to the other, according to an embodiment of the present disclosure.
FIG. 2 is a cross-sectional substrate segment illustrating a growth step, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Described herein are techniques for forming channel structures for field effect transistors (FETs) having a channel current path parallel to a surface of a substrate. 3D in-situ horizontal growth of the channel and source/drain (S/D) regions can allow for custom doping in the 3D horizontal nanosheet direction for n-type metal-oxide-semiconductor (NMOS) and p-type metal-oxide-semiconductor (PMOS) devices. Multiple 3D stacks of epitaxial material can be fabricated on a transistor stack that is N layers in height or thickness. A lower threshold voltage can be obtained because all 3D lateral channel and drain regions are grown simultaneously for better drain/derivative voltage over time. An ultra-short channel length can be achieved with techniques herein since the channel is epitaxially grown in the 3D horizontal nanosheet direction at the monolayer level. Also, because the channel can be grown in a dielectric cavity, a precise channel cross sectional area can be obtained. CFET selective epitaxial growth can be obtained with techniques herein in the same 3D stack by using selective dielectric sidewall integration options.

Now, with reference to the Drawings, first a method is described for forming a horizontal 3D nanosheet NMOS gate-all-around (GAA) device with 3D horizontal epitaxial growth of channel and source or drain region using a metal last option, wherein the thickness or height of the device is two horizontal 3D nanosheets.

To this end, FIG. 1 is a cross-sectional substrate segment illustrating a dielectric layer stack of alternating dielectric layers grown with two or more dielectric layers, each dielectric being selected to be etch selective to the other, according to an embodiment of the present disclosure. In an embodiment, the stack includes alternating layers of a first dielectric 110 and a second dielectric 120 disposed on a layer of a sixth dielectric 160, a substrate 105 disposed below the sixth dielectric 160, and a layer of a hardmask 199 disposed overtop the stack. For example, the alternating layers can include three layers of the first dielectric 110 and two layers of the second dielectric 120, and the hardmask 199 is disposed overtop the layer of the first dielectric 110 disposed furthest from the substrate 105. The sixth dielectric 160 can be, for example, silicon oxynitride or a high-k material. As shown, the layer stack can be patterned using an etch mask 198 and etched to create openings down to the substrate 105 or other underlying semiconductor material to enable epitaxial growth within the openings. The openings can be for eventually forming future NMOS (or PMOS) source or drain regions in the space adjacent to the second dielectric 120. As shown, the one large dielectric layer stack can be divided by the etching (i.e., portions of the dielectric layer stack separated by the openings).

FIG. 2 is a cross-sectional substrate segment illustrating a growth step, according to an embodiment of the present disclosure. In an embodiment, the etch mask 198 can be removed, followed by epitaxial growth within the openings to fill the openings in the dielectric layer stack and form a epitaxial layer stack. For example, as shown, the epitaxial growth can result in growth of a SiGe 180 and N+ Si 185. The SiGe 180 can be disposed at the bottom closest to the substrate 105, or in other words, the SiGe 180 can be the first-formed epitaxial segment of the epitaxial layer stack. Advantageously, the method provides the ability to grow the channel region instead of the source region as compared to common device and, in particular, nanosheet formation. Future horizontal channel and drain regions can be formed in a horizontal direction or plane of the second dielectric 120, followed by the hardmask 199 deposition and CMP for overburden removal.

FIG. 3 is a cross-sectional substrate segment illustrating further definition of the epitaxial layer stack, according to an embodiment of the present disclosure. In an embodiment, the substrate 105 can be masked again to remove the dielectric layer stack while leaving a portion of the dielectric layer stack surrounding the epitaxial layer stack. That is, the etch mask 198 can cover the epitaxial layer stacks with an overhang adjacent to the grown epitaxial regions in the epitaxial layer stack. As shown, the etch mask 198 can preserve the dielectric stack in the X-X' and Y-Y' directions, wherein the Y-Y' direction is into the plane of the figure. Together, the remaining dielectric layer stack and the epitaxial layer stack can form a mixed layer stack.

FIG. 4 is a cross-sectional substrate segment illustrating a fill, according to an embodiment of the present disclosure. In an embodiment, the etch mask 198 can be removed and a deposition of a third dielectric 130 can fill in around the mixed layer stacks. Notably, the third dielectric 130 can be selective to other dielectric materials and the hardmask 199 or capping layer.

Figure 5:
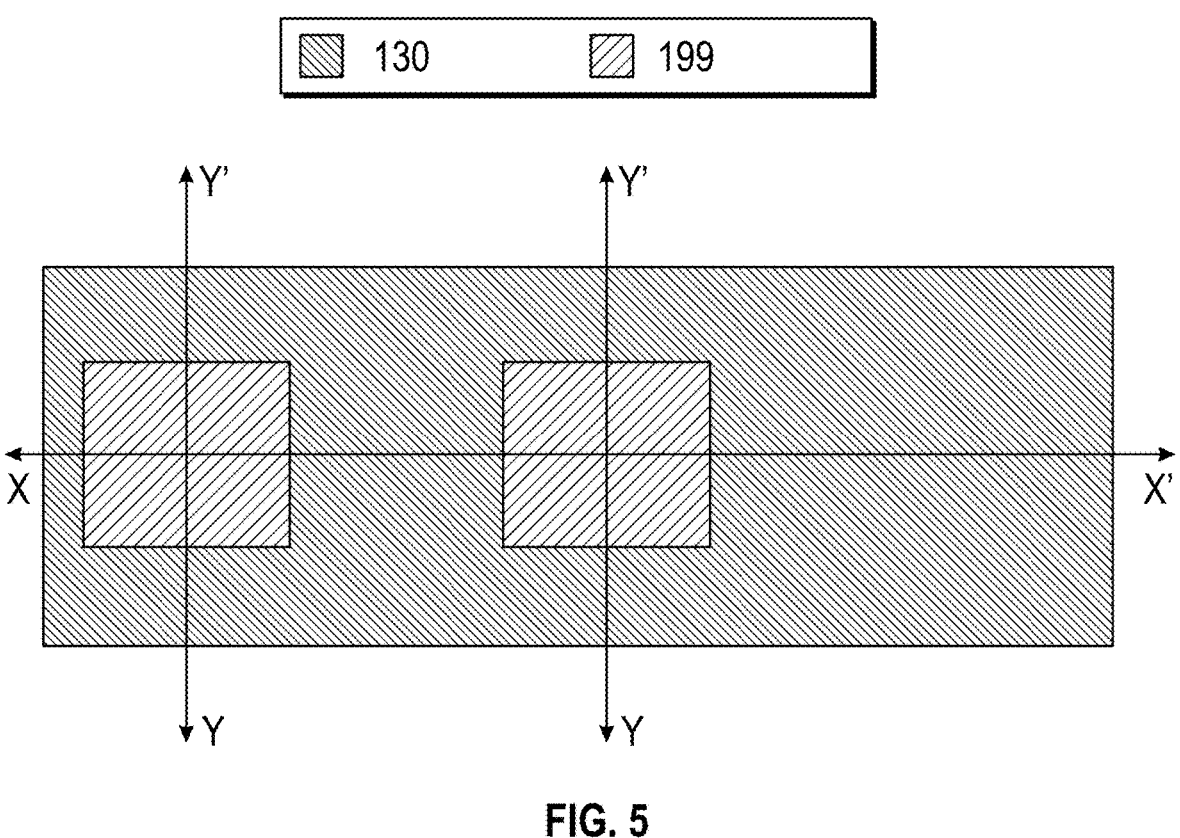
FIG. 5 is a top-down schematic illustrating the fill around the mixed layer stacks, according to an embodiment of the present disclosure.

FIG. 5 is a top-down schematic illustrating the fill around the mixed layer stacks, according to an embodiment of the present disclosure. In an embodiment, the top-down schematic can show how the mixed layer stacks are surrounded by the third dielectric 130 fill.

Figure 6:
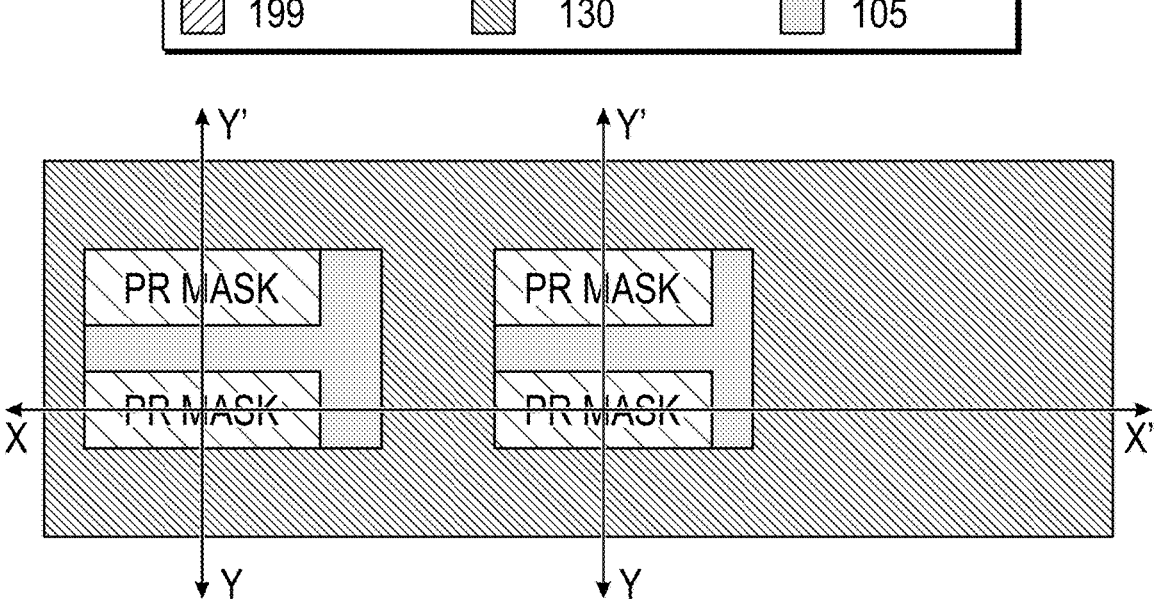
FIG. 6 is a top-down schematic illustrating the etch mask pattern formed over the mixed layer stack, according to an embodiment of the present disclosure.

Next, FIG. 6 is a top-down schematic illustrating the etch mask 198 pattern formed over the mixed layer stack, according to an embodiment of the present disclosure. In an embodiment, four horizontal nanosheet stacks with a height of two transistors can be patterned. The pattern can lead to exposure of the SiGe 180 material post-etch on both sides of the SiGe 180/Si stack.

Figures 7, 8:
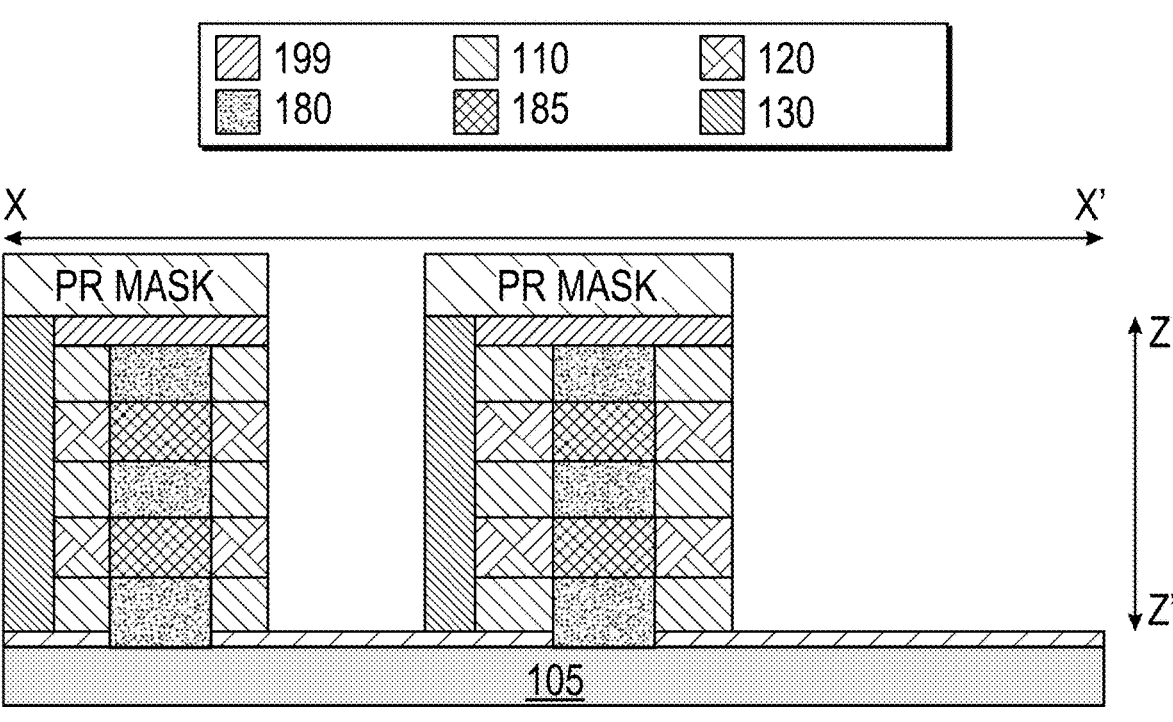
FIG. 7 is a cross-sectional substrate segment illustrating an etch mask formed for etching to pattern the future removal of a side of the dielectric layer stack, according to an embodiment of the present disclosure.
FIG. 8 is a cross-sectional substrate segment illustrating the mixed layer stacks after etch mask removal, according to an embodiment of the present disclosure.

FIG. 7 is a cross-sectional substrate segment illustrating an etch mask formed for etching to pattern the future removal of a side of the dielectric layer stack, according to an embodiment of the present disclosure. In an embodiment, the side of the dielectric stack that can be removed via the etch can be along the Y-Y' direction. As shown, the etch mask 198 can be used to protect predetermined portions while the unprotected or uncovered portions of the third dielectric 130 are etched.

FIG. 8 is a cross-sectional substrate segment illustrating the mixed layer stacks after etch mask removal, according to an embodiment of the present disclosure. In an embodiment, the etch mask 198 can be removed and the SiGe 180 can be removed from the epitaxial layer stack.

Figures 9, 10:
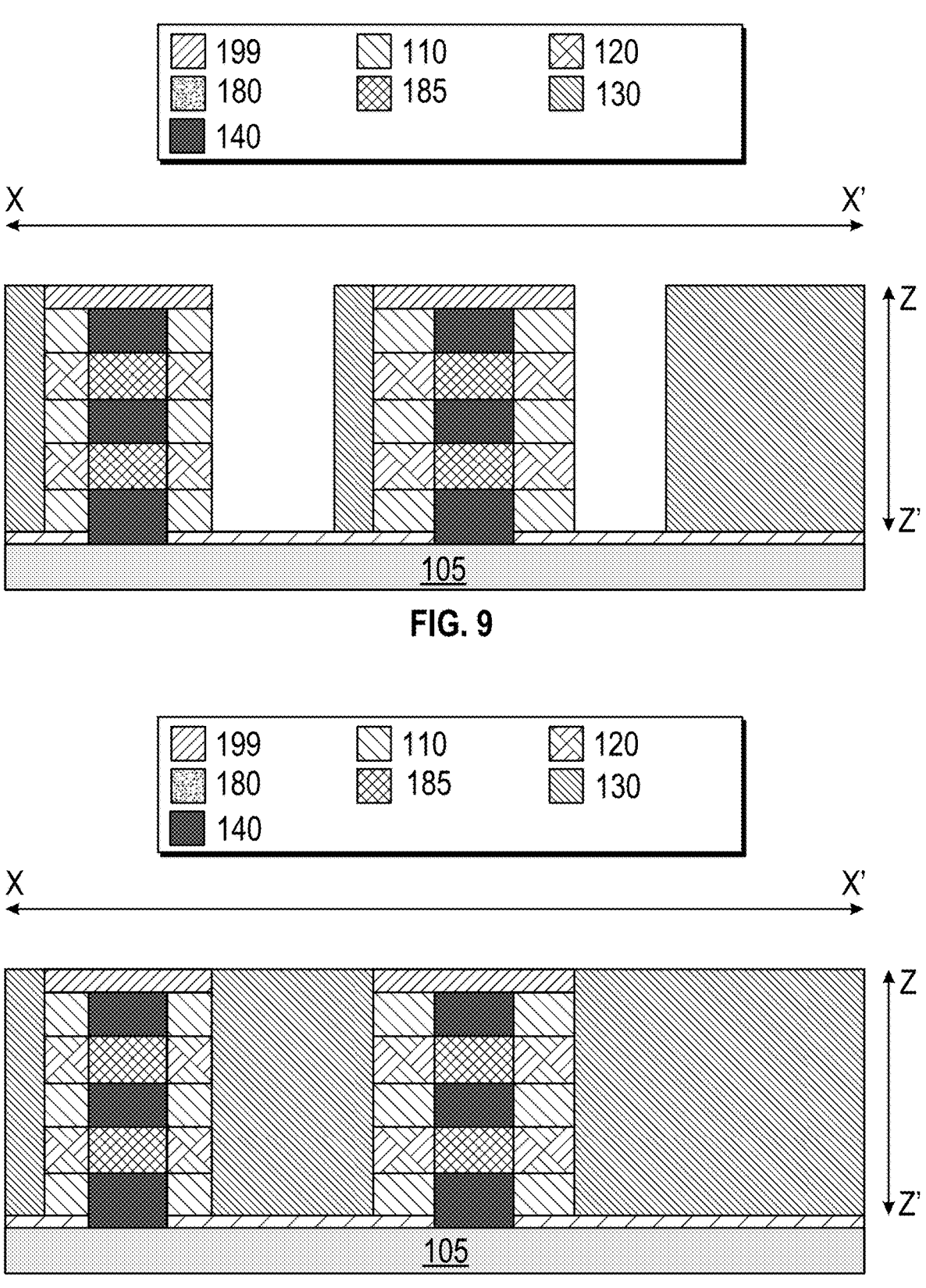
FIG. 9 is a cross-sectional substrate segment illustrating dielectric fill, according to an embodiment of the present disclosure.
FIG. 10 is a cross-sectional substrate segment illustrating dielectric fill, according to an embodiment of the present disclosure.

FIG. 9 is a cross-sectional substrate segment illustrating dielectric fill, according to an embodiment of the present disclosure. In an embodiment, a fourth dielectric 140 can be deposited in the portions where the SiGe 180 was removed. A chemical mechanical polish (CMP) can also be performed to remove overburden and to self-align the fourth dielectric 140 with the stack having the hardmask 199, and the third dielectric 130. This can essentially replace the SiGe 180 of the epitaxial layer stack with the fourth dielectric 140.

FIG. 10 is a cross-sectional substrate segment illustrating dielectric fill, according to an embodiment of the present disclosure. In an embodiment, the third dielectric 130 is filled in again and a CMP can be performed.

Figure 11:
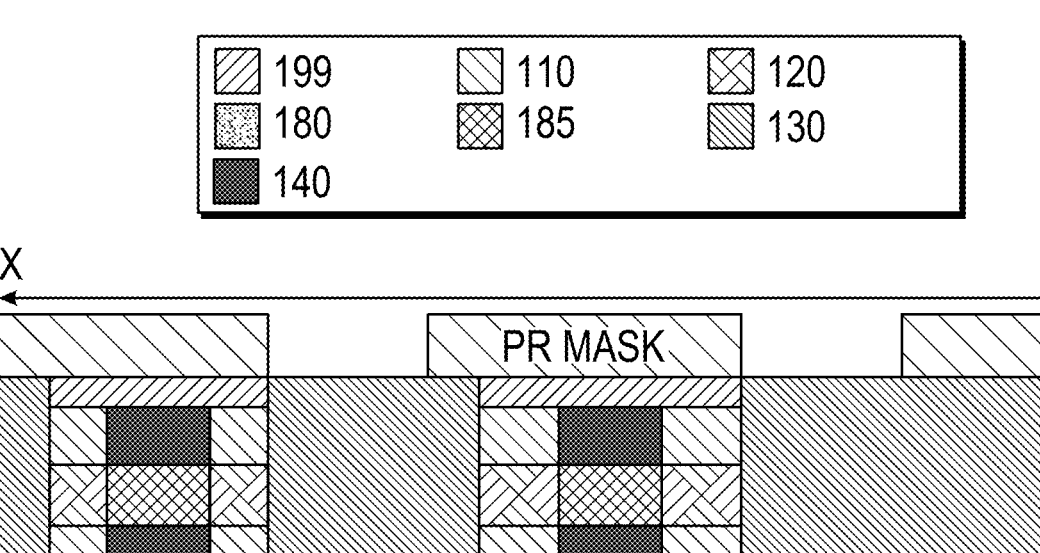
FIG. 11 is a cross-sectional substrate segment illustrating etch mask patterning, according to an embodiment of the present disclosure.

FIG. 11 is a cross-sectional substrate segment illustrating etch mask patterning, according to an embodiment of the present disclosure. In an embodiment, an etch mask 198 can be formed for uncovering access along a side, such as the right side as shown in FIG. 11, of the N+ Si 185 source region.

Figure 12:
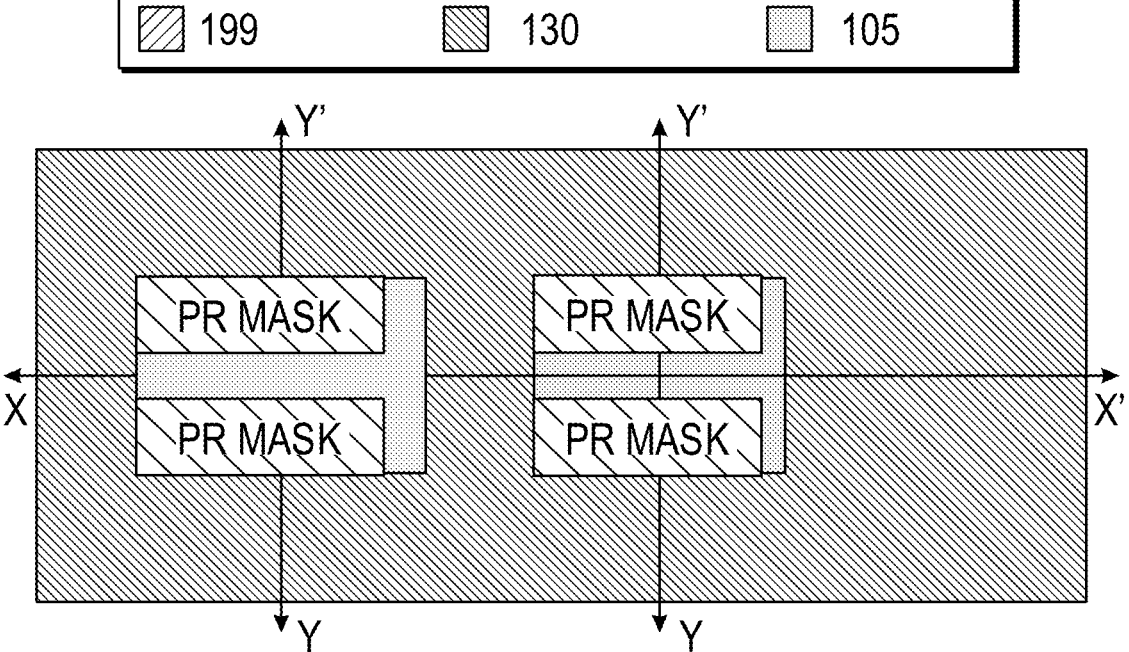
FIG. 12 is a top-down view of FIG. 11 prior to etching, according to an embodiment of the present disclosure.

FIG. 12 is a top-down view of FIG. 11 prior to etching, according to an embodiment of the present disclosure. In an embodiment, the etching can be directional and down to the substrate 105.

Figure 13:
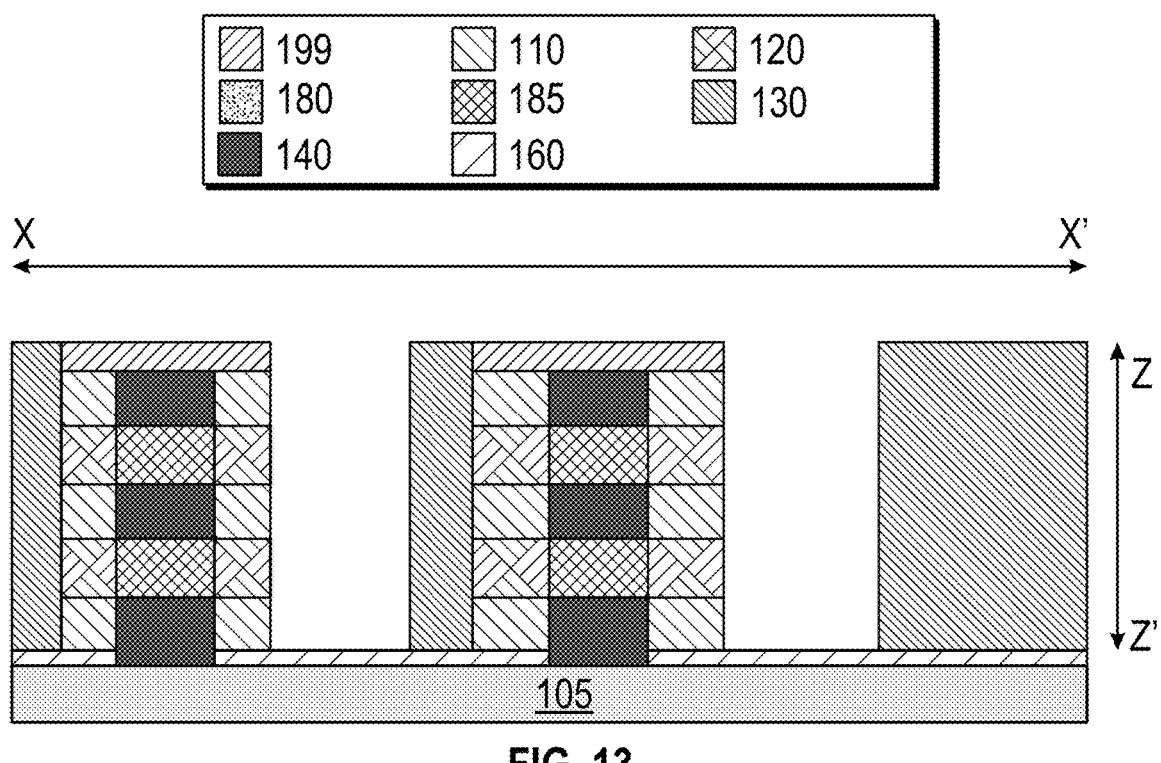
FIG. 13. is a cross-sectional substrate segment illustrating an etch step, according to an embodiment of the present disclosure.

FIG. 13. is a cross-sectional substrate segment illustrating an etch step, according to an embodiment of the present disclosure. In an embodiment, an anisotropic etch can be performed to etch uncovered portions of the third dielectric 130 to allow future access to the N+ Si 185 source region.

Figure 14:
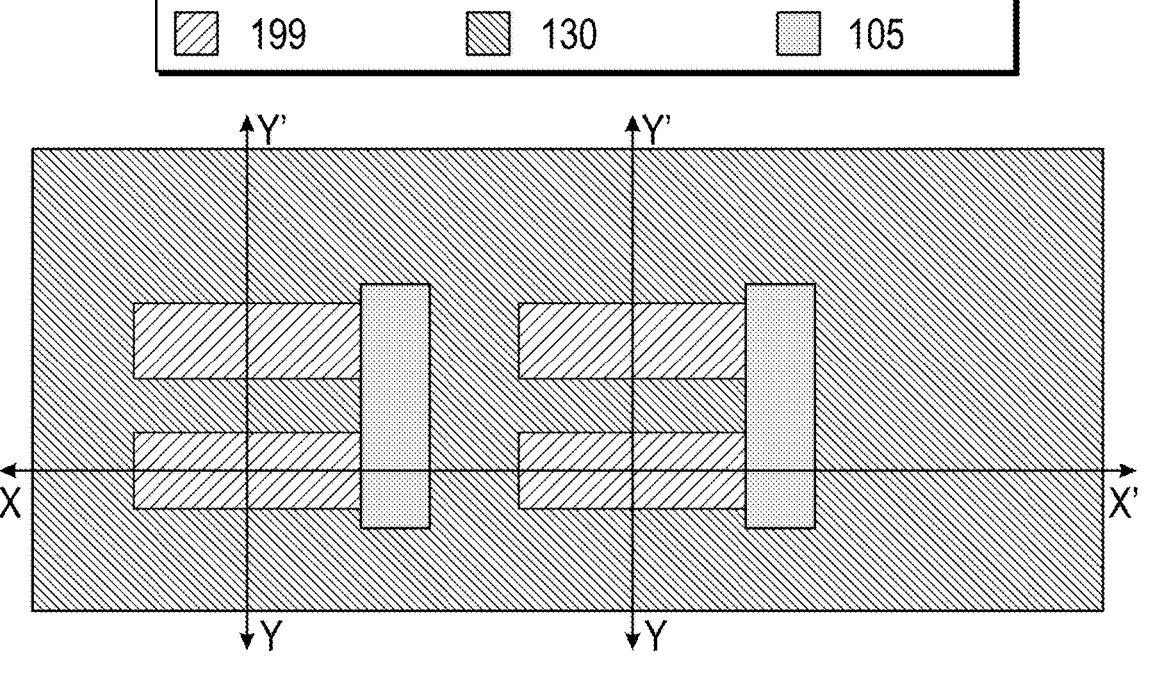
FIG. 14 is a top-down view of FIG. 13, according to an embodiment of the present disclosure.

FIG. 14 is a top-down view of FIG. 13, according to an embodiment of the present disclosure. In an embodiment, as shown, the right side of the mixed layer stack is uncovered.

Figure 15:
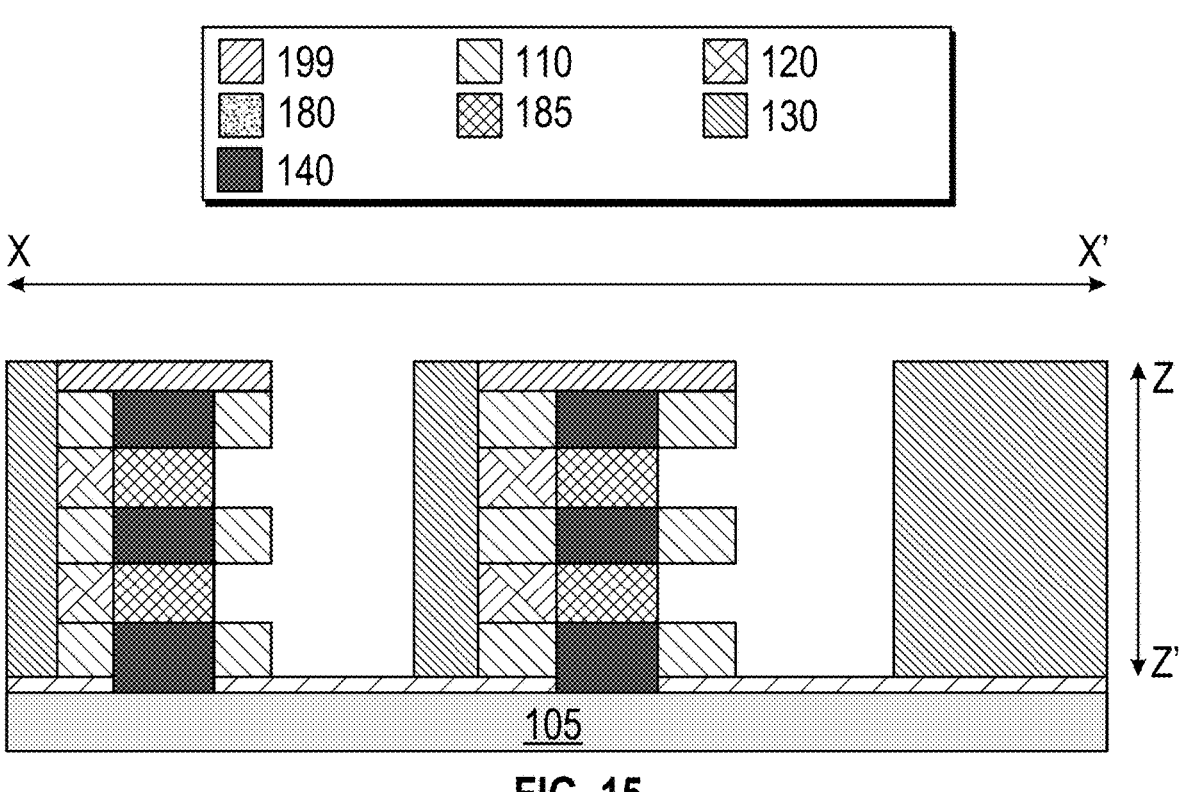
FIG. 15 is a cross-sectional substrate segment illustrating dielectric removal, according to an embodiment of the present disclosure.

FIG. 15 is a cross-sectional substrate segment illustrating dielectric removal, according to an embodiment of the present disclosure. In an embodiment, the second dielectric 120 can be removed from the uncovered side of the N+ Si 185 source region, leaving an opening.

Figure 16:
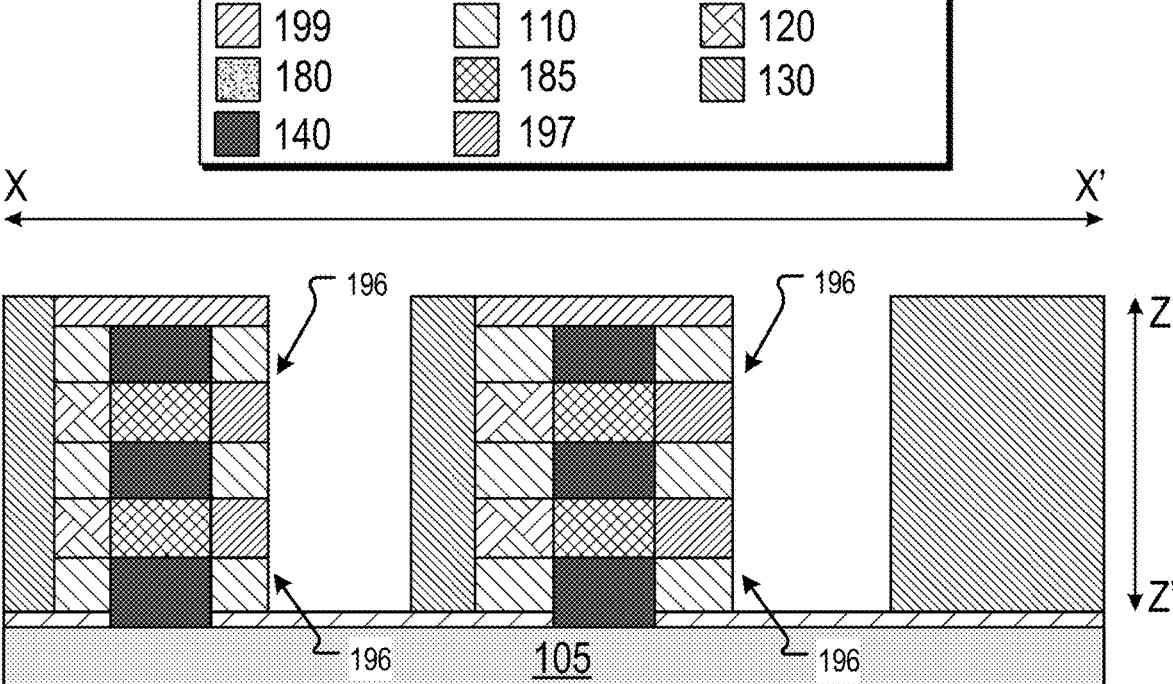
FIG. 16 is a cross-sectional substrate segment illustrating lateral or horizontal channel formation, according to an embodiment of the present disclosure.

FIG. 16 is a cross-sectional substrate segment illustrating lateral or horizontal channel formation, according to an embodiment of the present disclosure. In an embodiment, a channel structure 196 for a FET can be epitaxially grown laterally or horizontally in a direction parallel with a plane of the substrate 105 and formed from a channel material 197. The channel structure 196 can include growth with some amount of P-type doping, or be intrinsic semiconductor, or include N+doping. The channel structure 196 can be grown within a horizontal opening of the dielectric layer stack, and thus the channel structure 196 can grow horizontally from the epitaxial layer stack. Multiple channel structures 196 can be simultaneously grown in a given layer stack for vertically stacked lateral GAA devices. Notably and advantageously, since a precise cavity for the epitaxy is defined, a uniform channel cross-sectional area can be tuned and achieved for the 3D horizontal nanosheet.

Figures 17, 18:
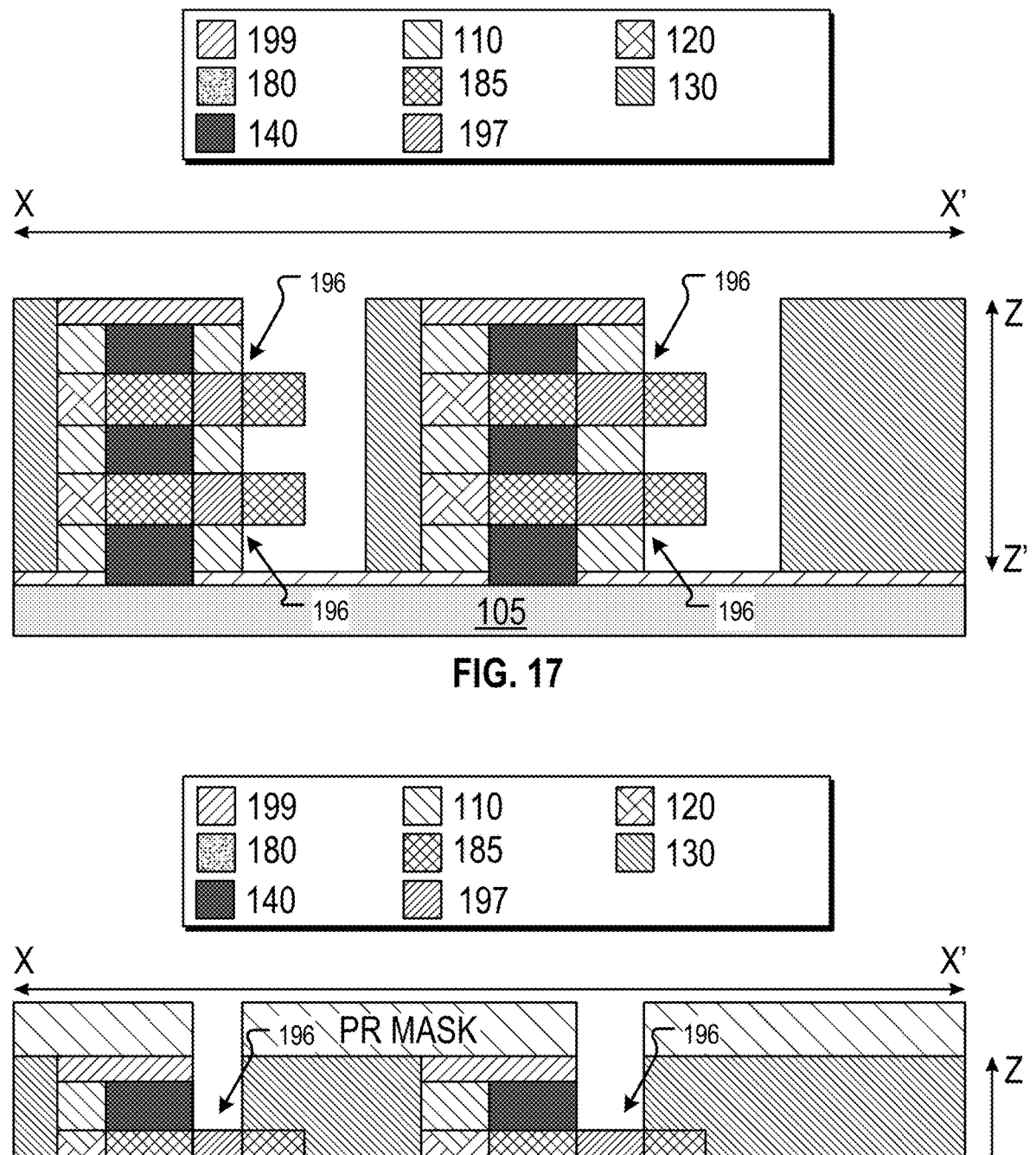
FIG. 17 is a cross-sectional substrate segment illustrating drain region formation, according to an embodiment of the present disclosure.
FIG. 18 is a cross-sectional substrate segment illustrating gate electrode masking and etching, according to an embodiment of the present disclosure.

FIG. 17 is a cross-sectional substrate segment illustrating drain region formation, according to an embodiment of the present disclosure. In an embodiment, after growing the channel structure 196 within openings of the dielectric layer stack, a drain region of N+ material can be epitaxially grown from the channel structure 196 to complete the horizontal nanosheet transistor, thereby including a source, channel/gate, and drain.

FIG. 18 is a cross-sectional substrate segment illustrating gate electrode masking and etching, according to an embodiment of the present disclosure. In an embodiment, the third dielectric 130 is deposited again to fill openings and a CMP can be performed to remove overburden. An etch mask 198 can be patterned for the gate electrode and an etch can be performed to uncover a future channel region. The first dielectric 110 in the channel region of the eventual device can then be removed.

Figure 19:
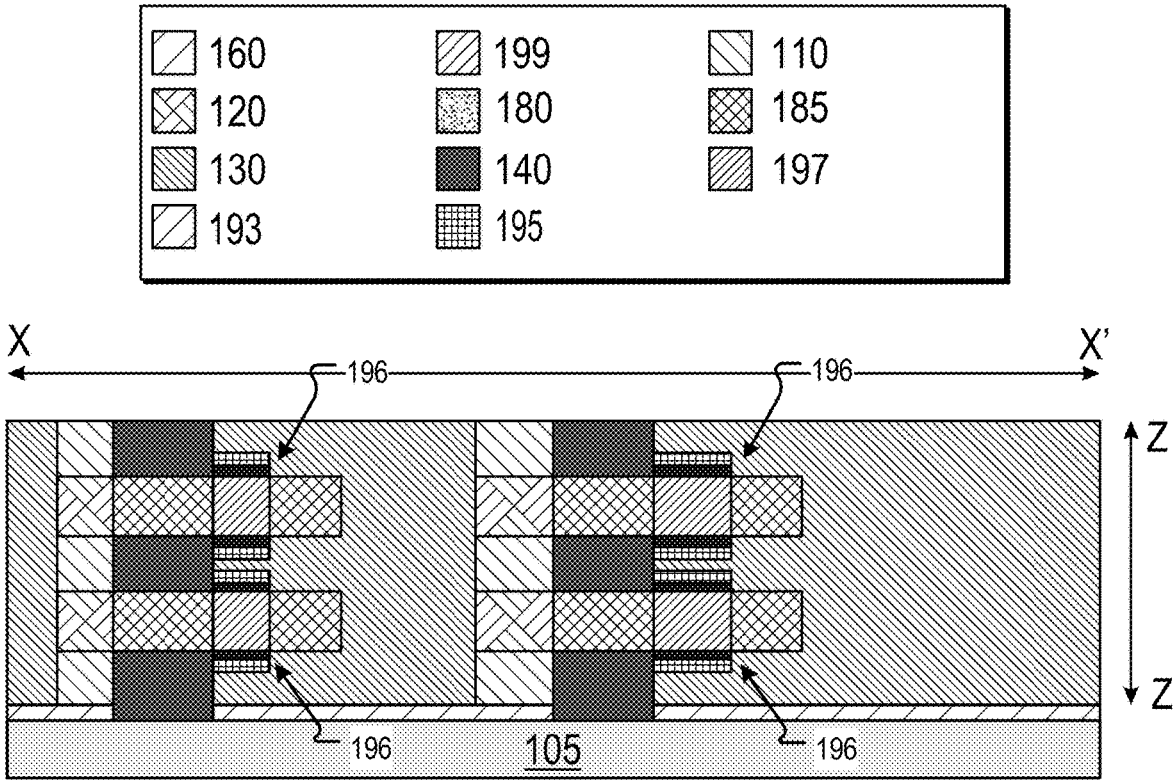
FIG. 19 is a cross-sectional substrate segment illustrating gate formation, according to an embodiment of the present disclosure.

FIG. 19 is a cross-sectional substrate segment illustrating gate formation, according to an embodiment of the present disclosure. In an embodiment, the etch mask 198 can be removed, the fill can be removed, a selective high-k material 193 can be deposited on channel regions for the gate dielectric, and a selective metal gate electrode 195 can be deposited to complete the transistors.

Described herein is a similar method, but instead two different types of devices can result. For example, an NMOS device can be formed over a PMOS device, or vice versa. The process flow can be similar to the steps described above, except that the dielectric layer stack of alternating layers includes at least three different dielectric materials. For example, the NMOS device can include layers of the second dielectric 120, and the PMOS device can include layers of a fifth dielectric 150. Using different dielectric layers of different etch selectivities can mean that predetermined dielectric layers surrounding an epitaxial layer stack can be selectively removed for N+ horizontal epitaxial growth separately from P+ horizontal epitaxial growth. Thus, one type of channel material can be grown at a different time compared to another type of channel material. After first channel structures 196a are grown and the corresponding drain regions are grown, the drain regions can be covered or protected with a selective dielectric 191 deposition. The first channel structures 196a can be already covered (and protected) with the dielectric layer stack materials. With the first channel structure 196a and drain region covered with dielectric, epitaxial horizontal growth of second channel structures 196b and drain regions can be executed. As shown, the material for the channel structure is the same for both the first channel structure 196a and the second channel structure 196b, but they need not be the same as previously described. After, channel structures can be uncovered for formation of gate stacks thereon.

Figure 20:
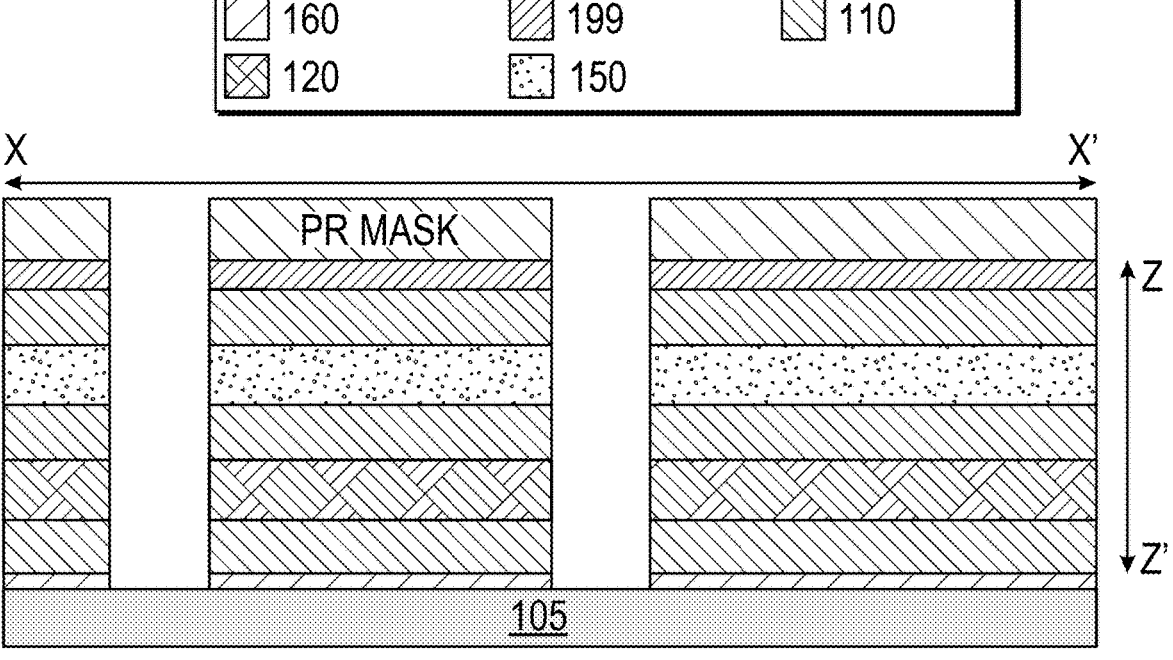
FIG. 20 is a cross-sectional substrate segment illustrating a dielectric layer stack of alternating dielectric layers grown with three or more dielectric layers, according to an embodiment of the present disclosure.

FIG. 20 is a cross-sectional substrate segment illustrating a dielectric layer stack of alternating dielectric layers grown with three or more dielectric layers, according to an embodiment of the present disclosure. As shown, a first layer of the first dielectric 110 can be disposed over top the sixth dielectric 160 layer, a layer of the second dielectric 120 can be disposed overtop the first layer of the first dielectric 110, a second layer of the first dielectric 110 can be disposed over top the layer of the second dielectric 120, a layer of the fifth dielectric 150 can be disposed over top the second layer of the first dielectric 110, a third layer of the first dielectric 110 can be disposed over top the layer of the fifth dielectric 150, and the hardmask 199 can be disposed over top the third layer of the first dielectric 110. Also, an etch mask 198 can be patterned over the dielectric layer stack and hardmask 199. An etch can be performed to create openings down to the substrate 105 for eventually forming NMOS and PMOS source or drain regions in the space adjacent to the second dielectric 120 or the fifth dielectric 150, respectively.

Figure 21:
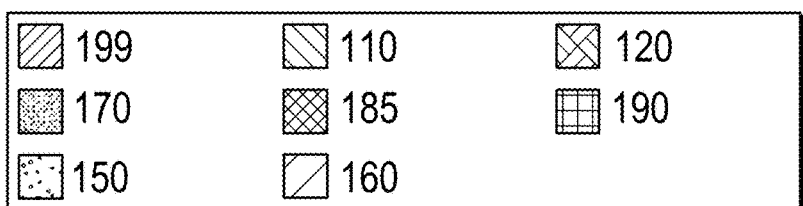
FIG. 21 is a cross-sectional substrate segment illustrating epitaxial growth, according to an embodiment of the present disclosure.
Figure 21:
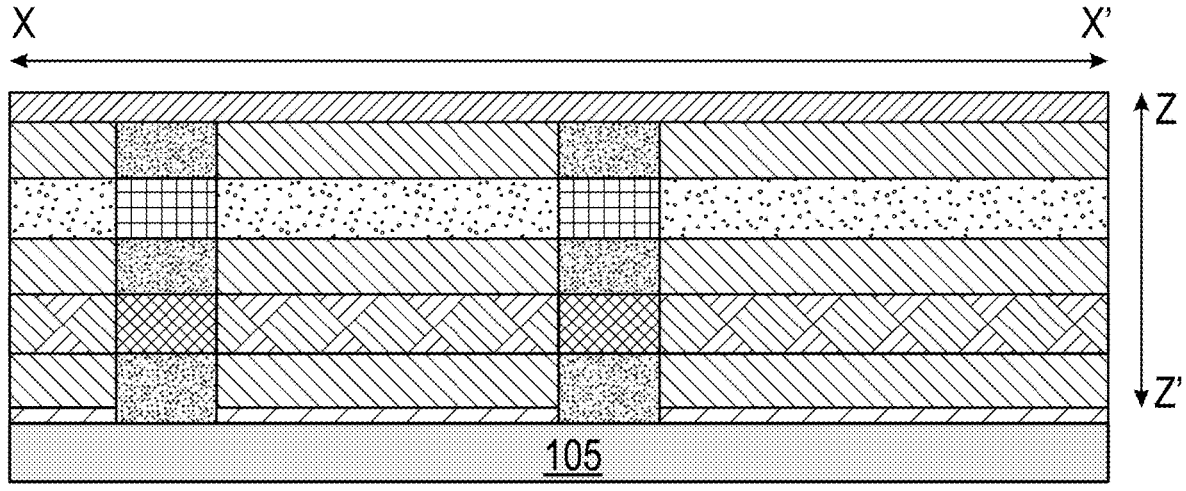

FIG. 21 is a cross-sectional substrate segment illustrating epitaxial growth, according to an embodiment of the present disclosure. In an embodiment, the etch mask 198 can be removed and an epitaxial growth can be performed to grow layers of a selective epi 170 (selective epitaxial material) over top the substrate 105, N+ Si 185 over top the selective epi 170, the selective epi 170 overtop the N+ Si 185, P+ epi 190 over top the selective epi 170, and the selective epi 170 over top the P+ epi 190.

Figure 22:
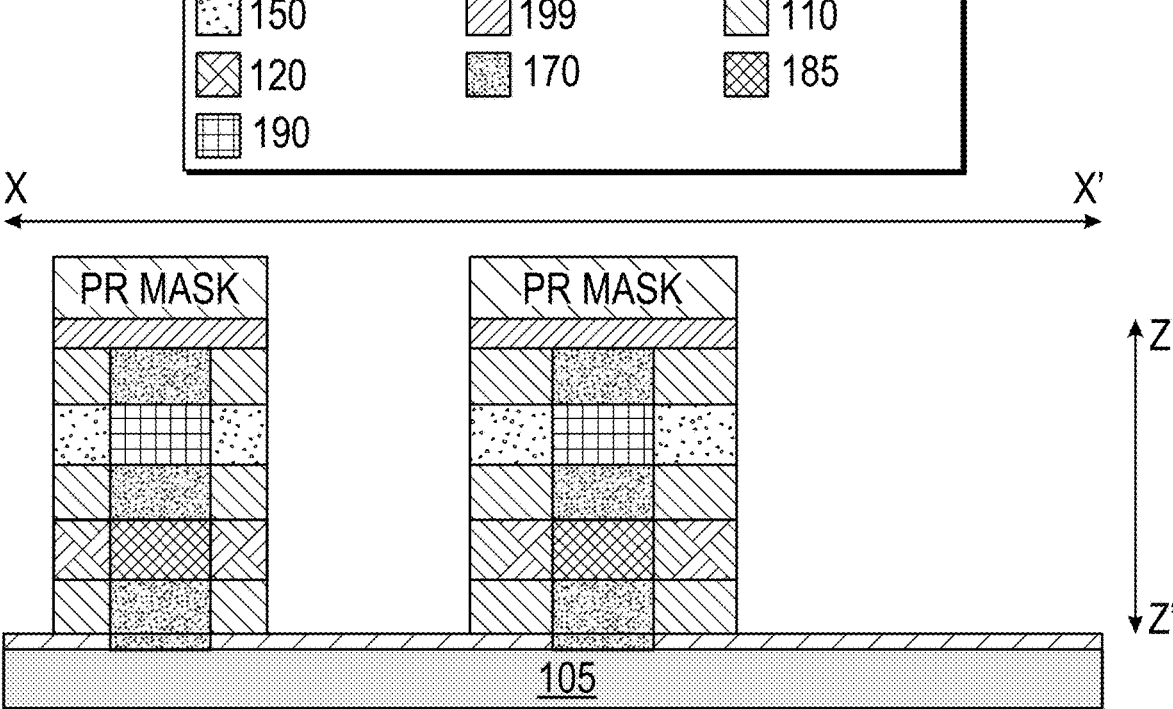
FIG. 22 is a cross-sectional substrate segment illustrating etch mask patterning and etching, according to an embodiment of the present disclosure.

FIG. 22 is a cross-sectional substrate segment illustrating etch mask patterning and etching, according to an embodiment of the present disclosure. In an embodiment, the substrate 105 can be masked again to remove the dielectric layer stack while leaving a portion of the dielectric layer stack surrounding the epitaxial layer stack. As shown, the etch mask 198 can preserve the dielectric stack in the X-X' and Y-Y' directions, wherein the Y-Y' direction is into the plane of the figure. Together, the remaining dielectric layer stack and the epitaxial layer stack can form a mixed layer stack.

Figure 23:
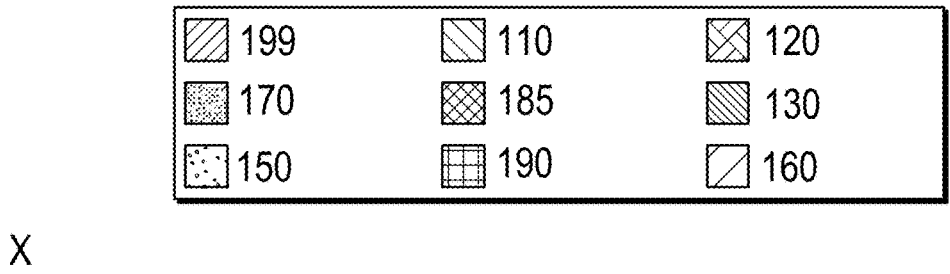
FIG. 23 is a cross-sectional substrate segment illustrating a fill, according to an embodiment of the present disclosure.
Figure 23:
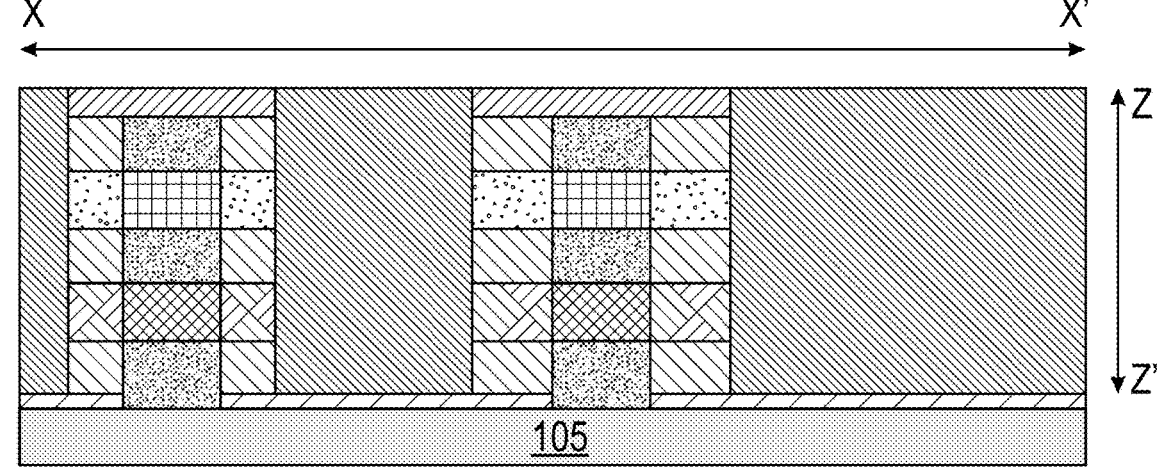

FIG. 23 is a cross-sectional substrate segment illustrating a fill, according to an embodiment of the present disclosure. In an embodiment, the etch mask 198 can be removed and a deposition of the third dielectric 130 can fill in around the mixed layer stacks.

Figure 24:
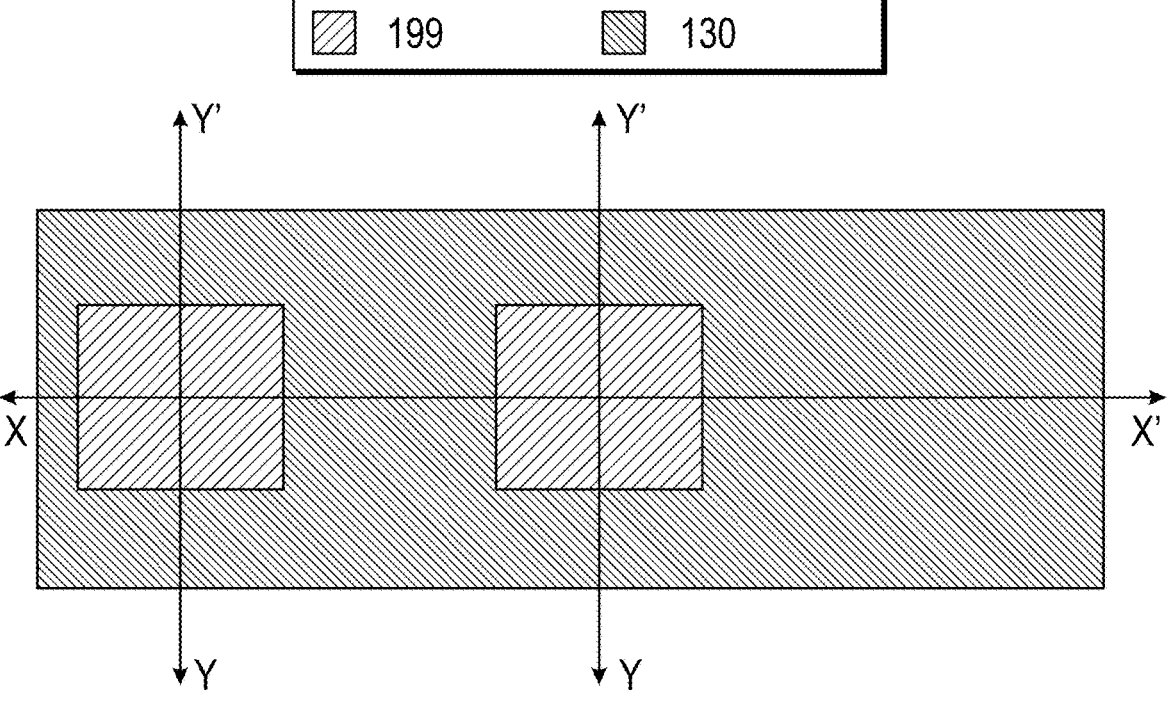
FIG. 24 is a top-down schematic illustrating the fill around the mixed layer stacks, according to an embodiment of the present disclosure.

FIG. 24 is a top-down schematic illustrating the fill around the mixed layer stacks, according to an embodiment of the present disclosure. In an embodiment, the top-down schematic can show how the mixed layer stacks are surrounded by the third dielectric 130 fill.

Figures 25, 26:
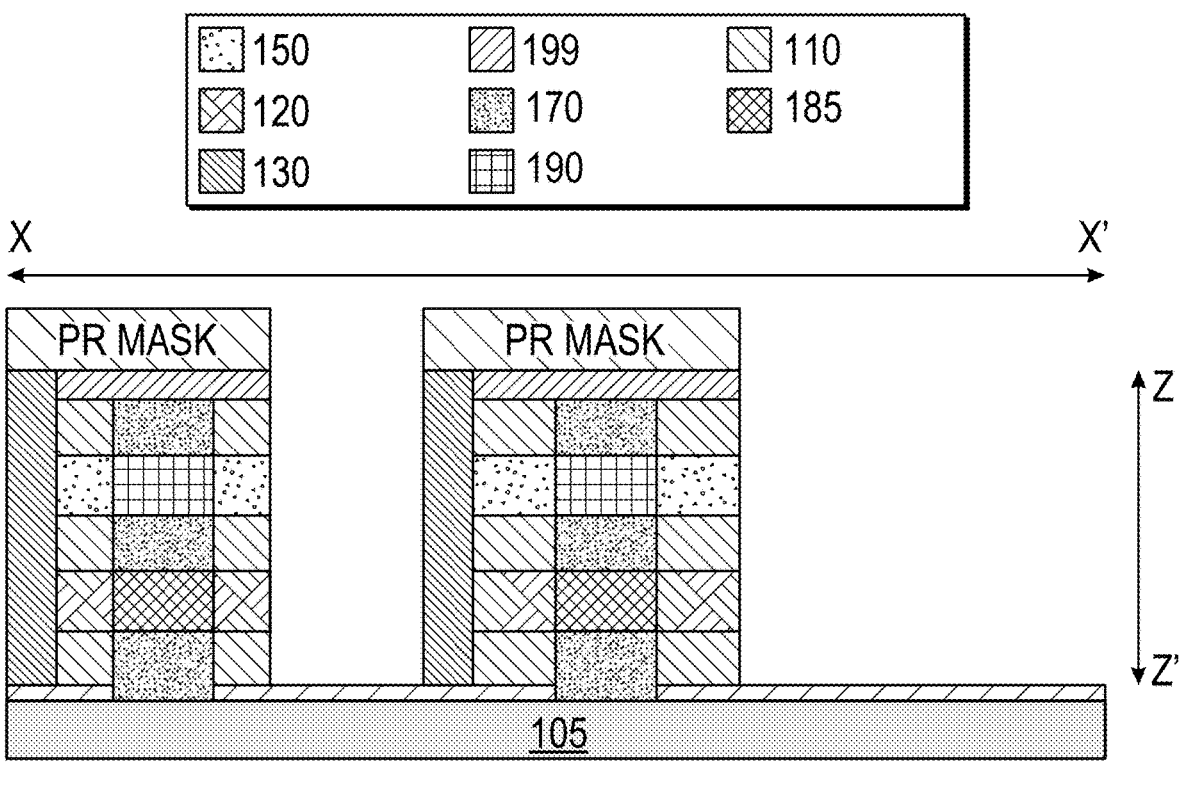
FIG. 25 is a cross-sectional substrate segment illustrating an etch mask formed for etching to pattern the future removal of a side of the dielectric layer stack, according to an embodiment of the present disclosure.
FIG. 26 is a cross-sectional substrate segment illustrating the mixed layer stacks after etch mask removal, according to an embodiment of the present disclosure.

FIG. 25 is a cross-sectional substrate segment illustrating an etch mask formed for etching to pattern the future removal of a side of the dielectric layer stack, according to an embodiment of the present disclosure. In an embodiment, the side of the dielectric stack that can be removed via the etch can be along the Y-Y' direction. As shown, one side of the third dielectric 130 surrounding the mixed layer stack can be removed and both sides of the epitaxial layer stack can be uncovered post-etch.

FIG. 26 is a cross-sectional substrate segment illustrating the mixed layer stacks after etch mask removal, according to an embodiment of the present disclosure. In an embodiment, the etch mask 198 can be removed and the sacrificial epi can be removed from the epitaxial layer stack.

Figure 27:
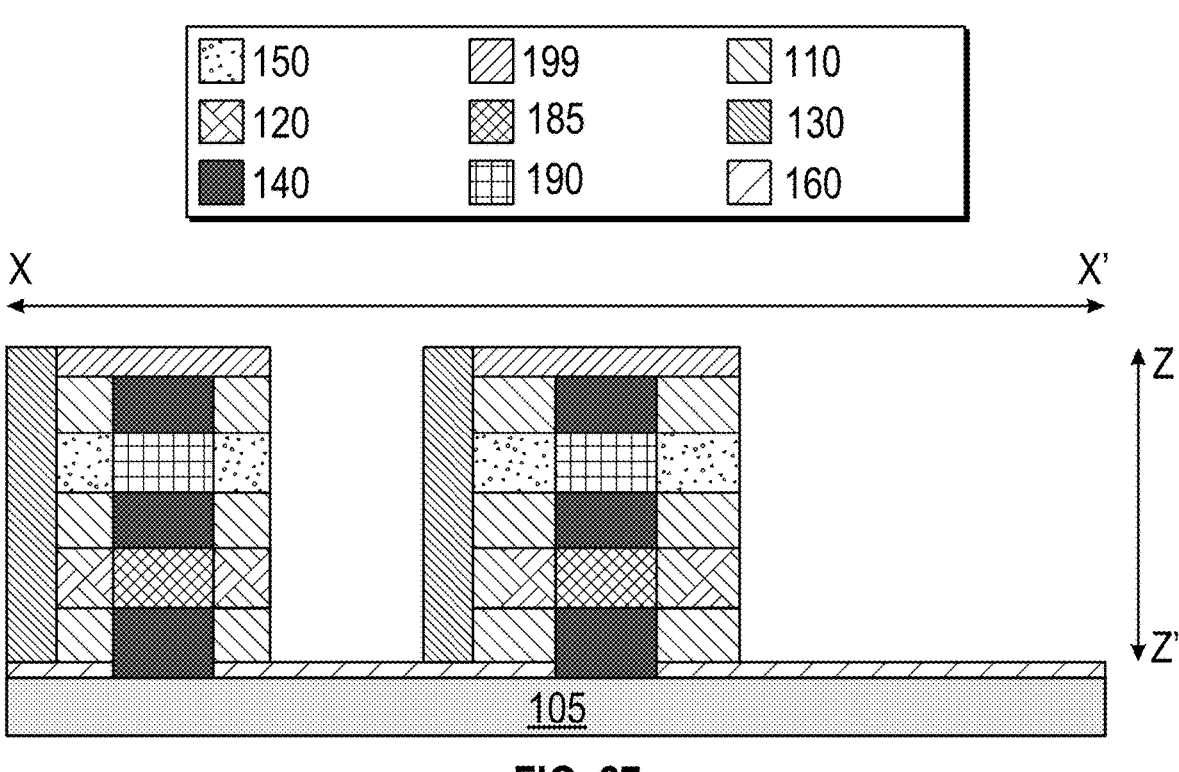
FIG. 27 is a cross-sectional substrate segment illustrating dielectric fill, according to an embodiment of the present disclosure.

FIG. 27 is a cross-sectional substrate segment illustrating dielectric fill, according to an embodiment of the present disclosure. In an embodiment, the fourth dielectric 140 can be deposited in the portions where the sacrificial epi was removed. A CMP can also be performed to remove overburden and to self-align the fourth dielectric 140 with the stack.

Figure 28:
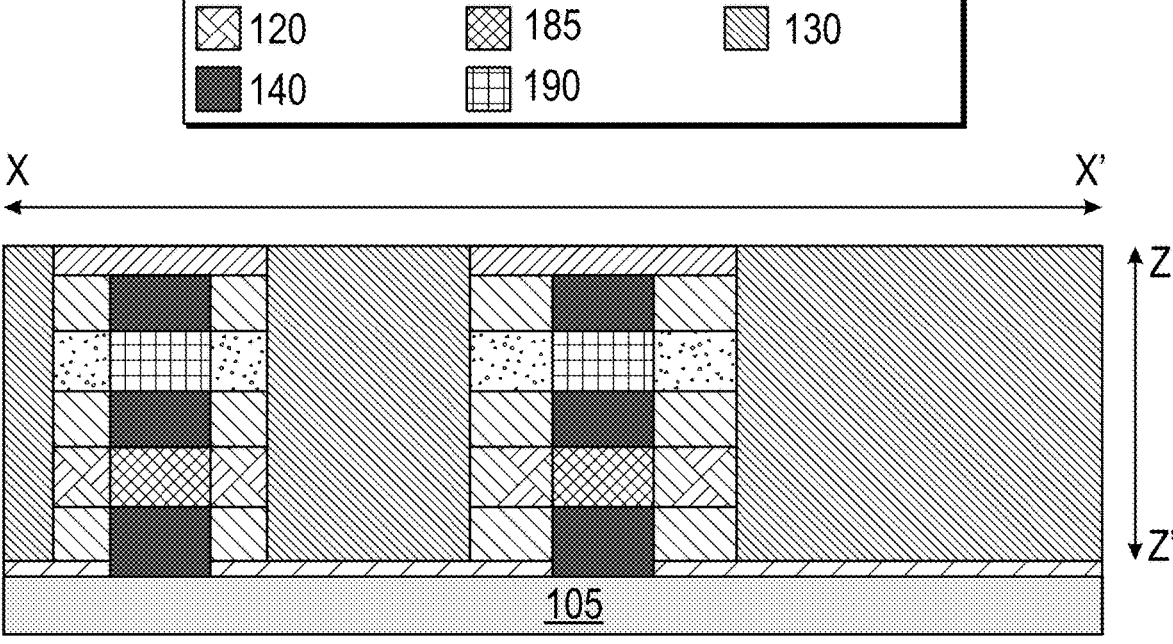
FIG. 28 is a cross-sectional substrate segment illustrating dielectric fill, according to an embodiment of the present disclosure.

FIG. 28 is a cross-sectional substrate segment illustrating dielectric fill, according to an embodiment of the present disclosure. In an embodiment, the third dielectric 130 is filled in again and a CMP can be performed.

Figure 29:
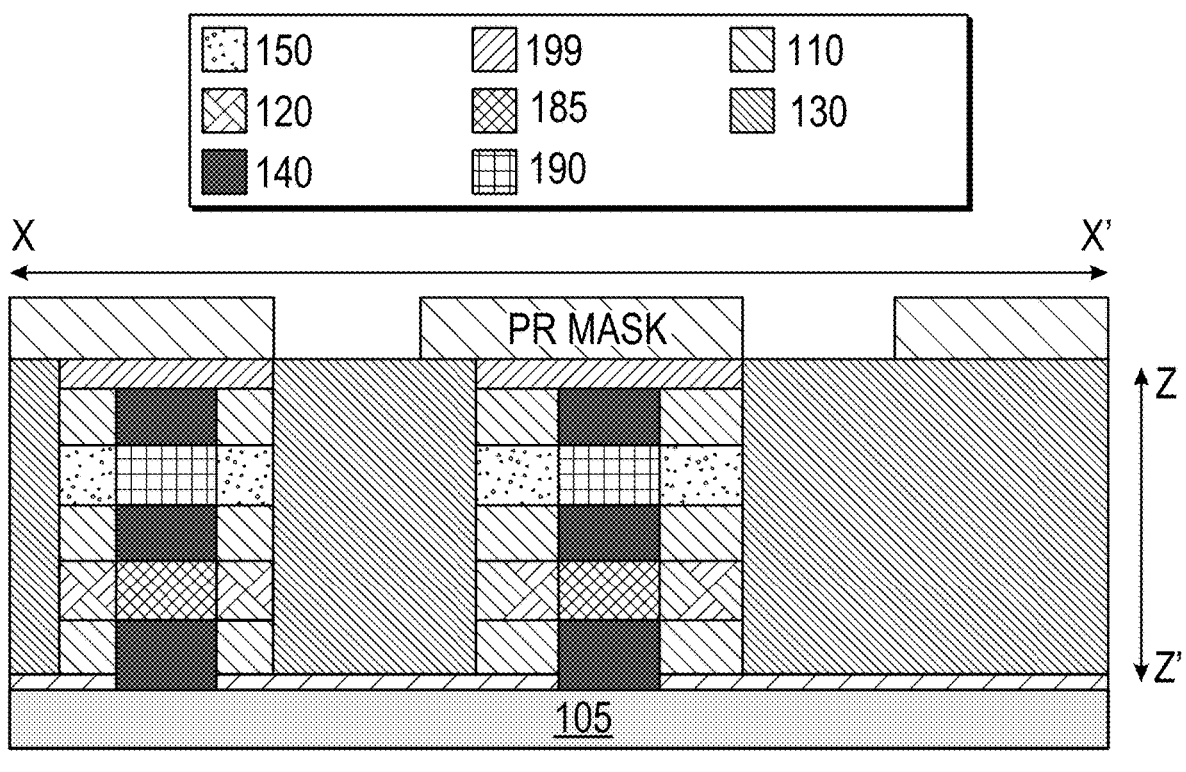
FIG. 29 is a cross-sectional substrate segment illustrating etch mask patterning, according to an embodiment of the present disclosure.

FIG. 29 is a cross-sectional substrate segment illustrating etch mask patterning, according to an embodiment of the present disclosure. In an embodiment, an etch mask 198 can be formed for uncovering access along a side, such as the right side as shown in FIG. 29, of the N+ Si 185 and P+ epi 190 source region.

Figure 30:
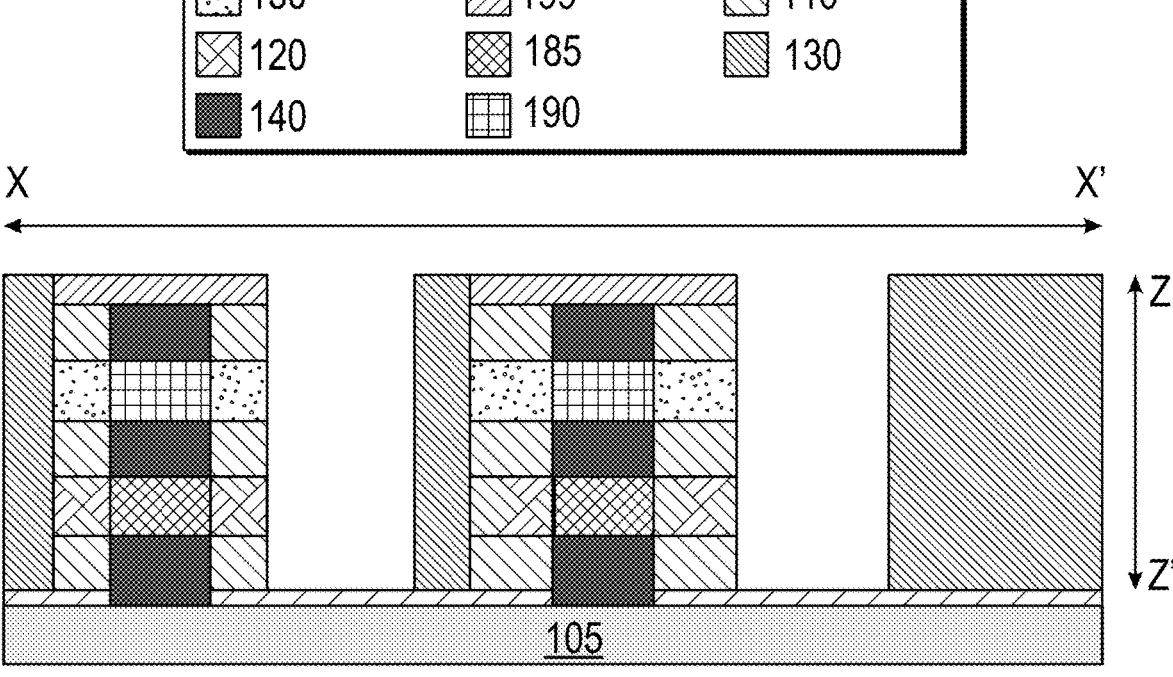
FIG. 30 is a cross-sectional substrate segment illustrating an etch step, according to an embodiment of the present disclosure.

FIG. 30 is a cross-sectional substrate segment illustrating an etch step, according to an embodiment of the present disclosure. In an embodiment, an etch can be subsequently performed, such as an anisotropic etch, to etch uncovered portions of the third dielectric 130 to allow future access to the N+ Si 185 source region and the P+ epi 190 source region.

Figures 31, 32:
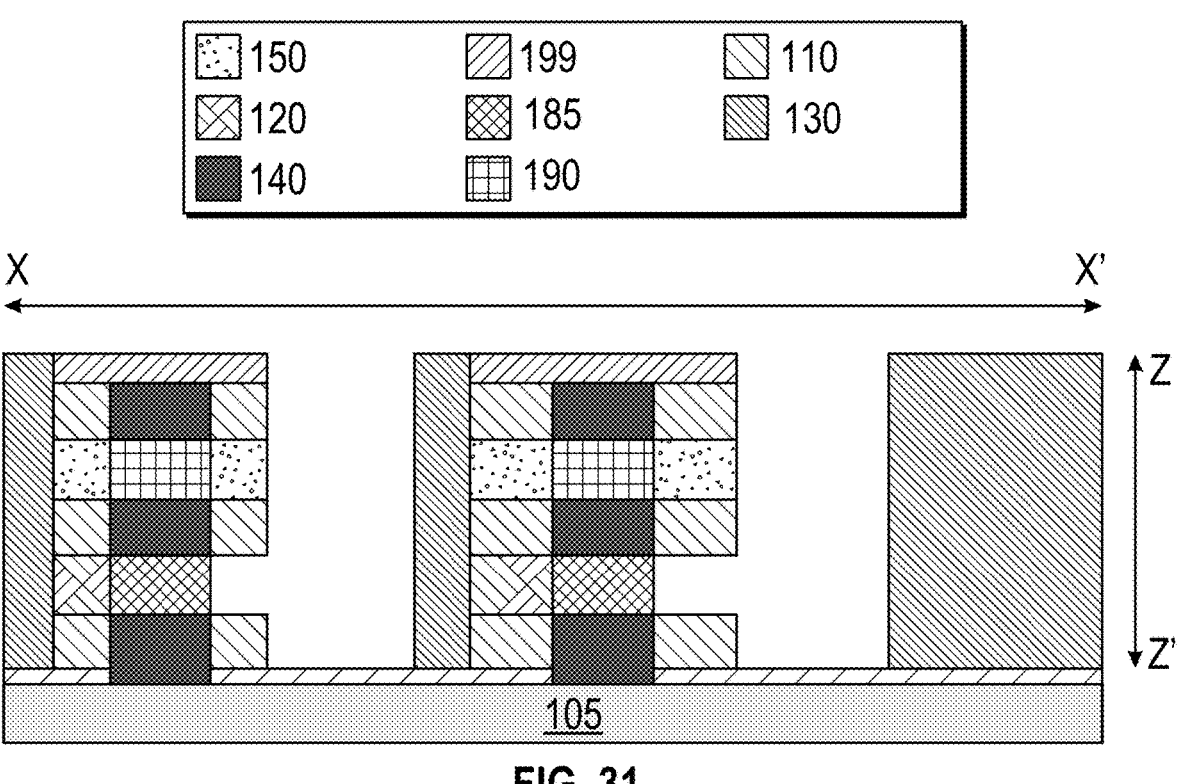
FIG. 31 is a cross-sectional substrate segment illustrating removal of the second dielectric proximal to the N+ Si 185 source region, according to an embodiment of the present disclosure.
FIG. 32 is a cross-sectional substrate segment illustrating lateral or horizontal channel formation, according to an embodiment of the present disclosure.

FIG. 31 is a cross-sectional substrate segment illustrating removal of the second dielectric 120 proximal to the N+ Si 185 source region, according to an embodiment of the present disclosure. In an embodiment, since the fifth dielectric 150 has selectivity relative to the second dielectric 120, only the second dielectric 120 may be removed to uncover the N+ Si 185 source region.

FIG. 32 is a cross-sectional substrate segment illustrating lateral or horizontal channel formation, according to an embodiment of the present disclosure. In an embodiment, a channel structure (the first channel structure 196a) for the NFET can be epitaxially grown laterally or horizontally in a direction parallel with a plane of the substrate 105 and proximal to the N+ Si 185 source region. Note the first channel structure 196a may be lightly doped p-type, intrinsic, or N+.

Figures 33, 34:
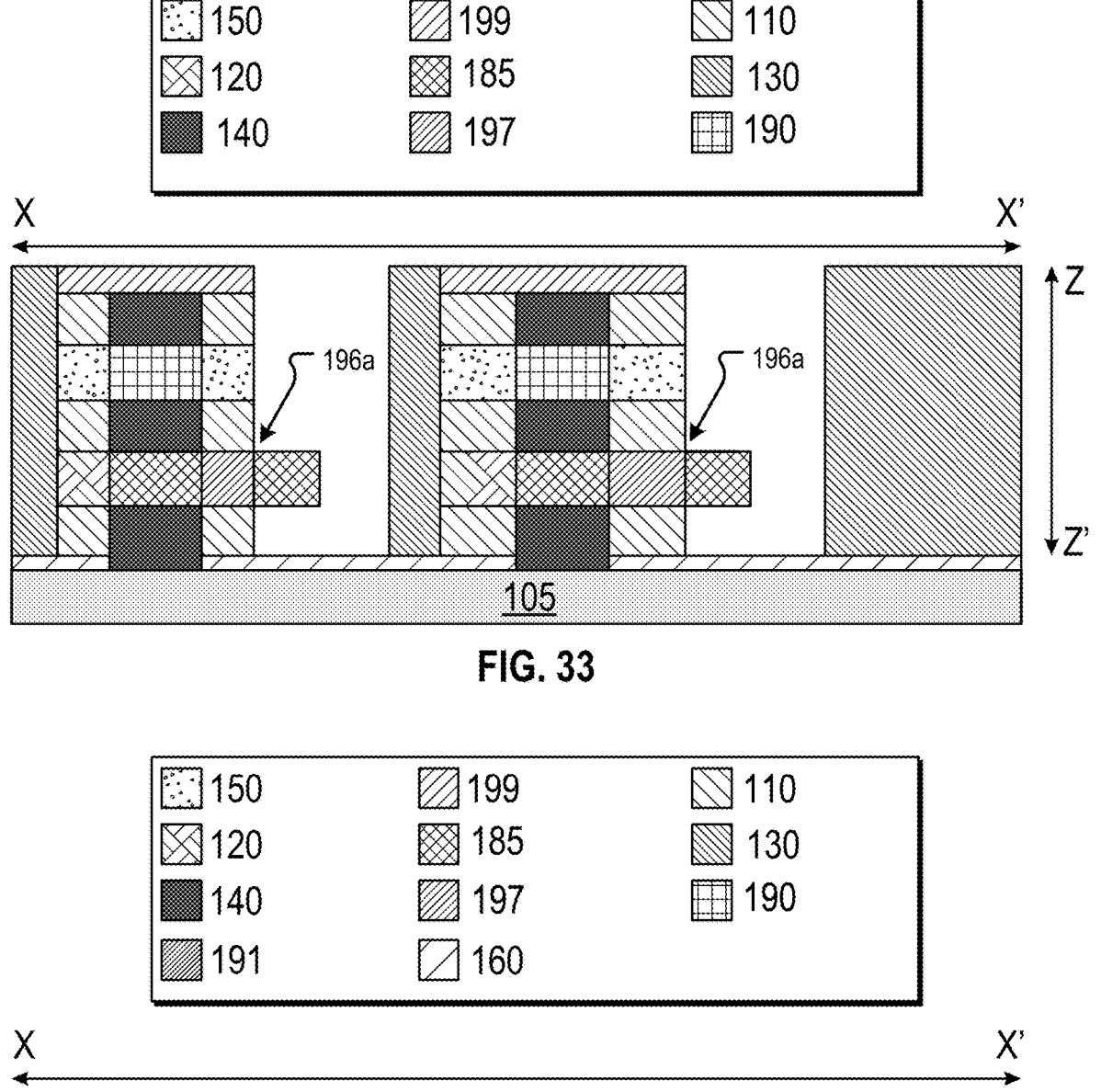
FIG. 33 is a cross-sectional substrate segment illustrating drain region formation, according to an embodiment of the present disclosure.
FIG. 34 is a cross-sectional substrate segment illustrating protection of the N+ drain regions, according to an embodiment of the present disclosure.

FIG. 33 is a cross-sectional substrate segment illustrating drain region formation, according to an embodiment of the present disclosure. In an embodiment, after growing the first channel structure 196a within openings of the dielectric layer stack, a drain region of N+ material can be epitaxially grown from the first channel structure 196a to complete the horizontal NMOS transistor, including a N+ source, channel/gate, and drain.

FIG. 34 is a cross-sectional substrate segment illustrating protection of the N+ drain regions, according to an embodiment of the present disclosure. In an embodiment, a selective dielectric 191 deposition can be performed to cover the N+ drain regions.

Figure 35:
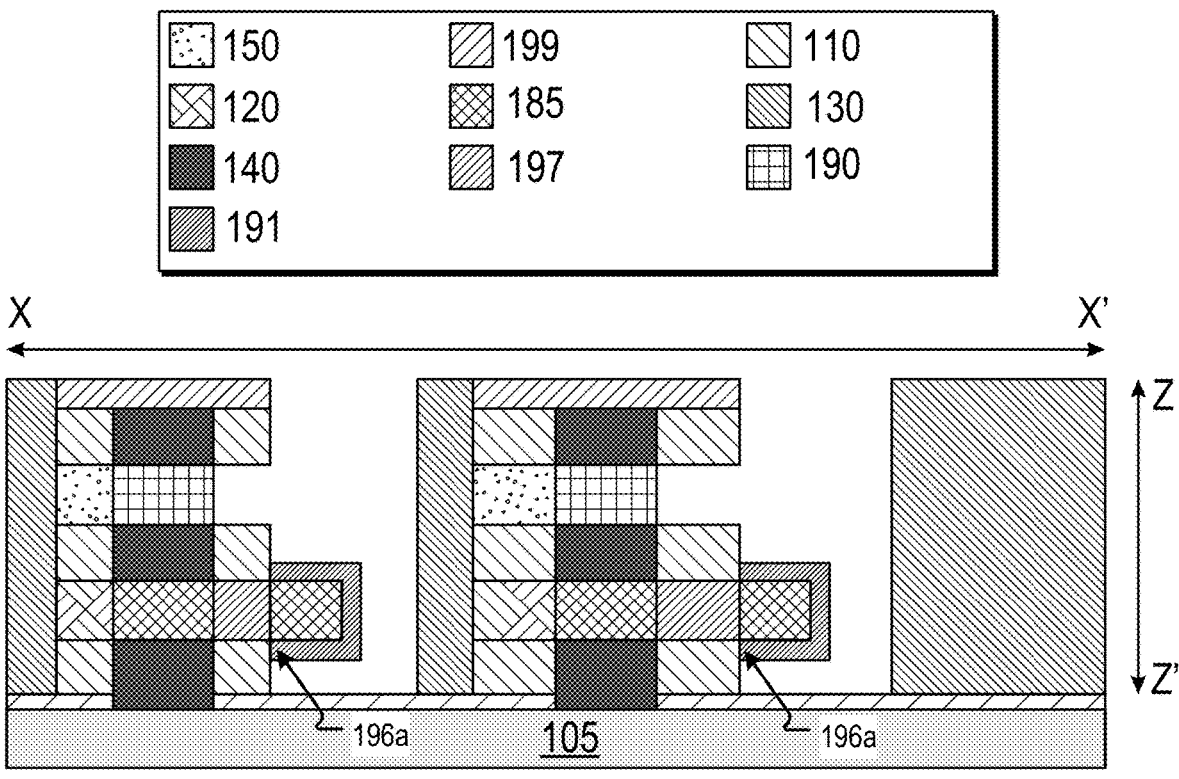
FIG. 35 is a cross-sectional substrate segment illustrating dielectric removal, according to an embodiment of the present disclosure.

FIG. 35 is a cross-sectional substrate segment illustrating dielectric removal, according to an embodiment of the present disclosure. In an embodiment, the fifth dielectric 150 can be removed from the uncovered side of the P+ epi 190 source region, leaving an opening.

Figure 36:
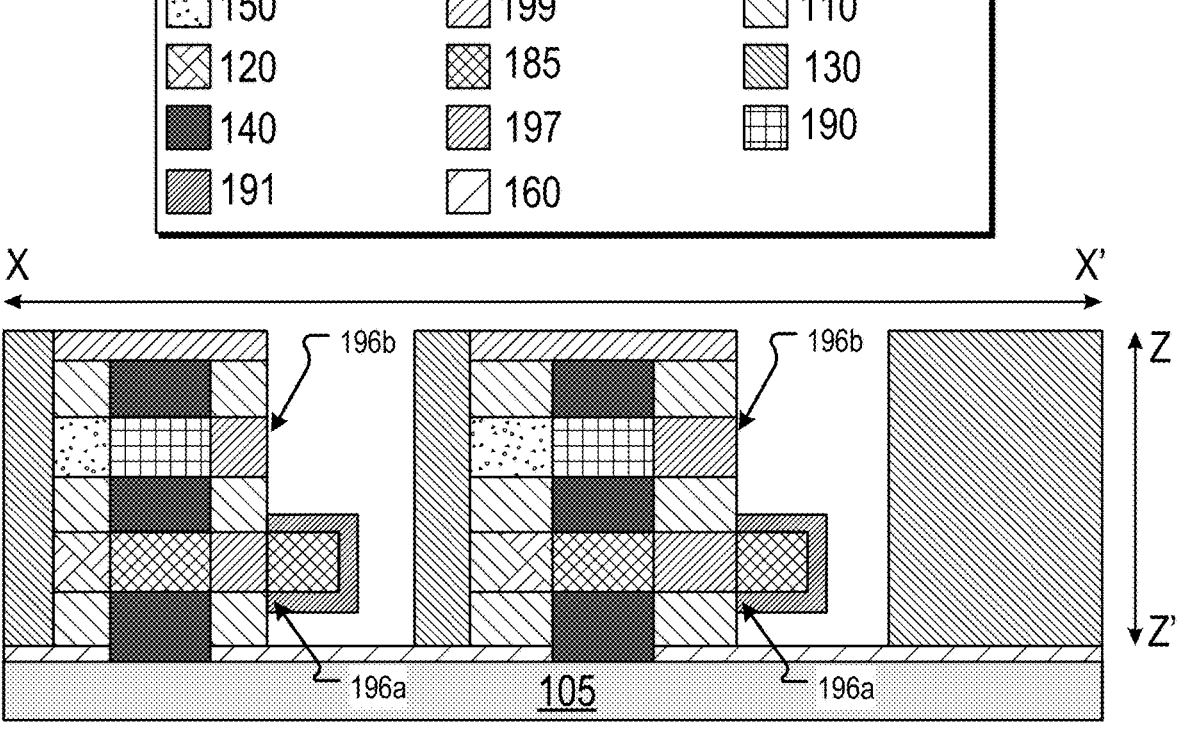
FIG. 36 is a cross-sectional substrate segment illustrating lateral or horizontal channel formation, according to an embodiment of the present disclosure.

FIG. 36 is a cross-sectional substrate segment illustrating lateral or horizontal channel formation, according to an embodiment of the present disclosure. In an embodiment, a channel structure (the second channel structure 196b) for the PFET can be epitaxially grown laterally or horizontally in a direction parallel with a plane of the substrate 105. The second channel structure 196b can be grown adjacent to the P+ epi 190. Note the second channel structure 196b may be intrinsic, n-type, or P+.

FIG. 37 is a cross-sectional substrate segment illustrating drain region formation, according to an embodiment of the present disclosure. In an embodiment, after growing the second channel structure 196b within openings of the dielectric layer stack, a drain region of P+material can be epitaxially grown from the second channel structure 196b to complete the horizontal PMOS transistor, including a P+ source, channel/gate, and drain.

FIG. 38 is a cross-sectional substrate segment illustrating dielectric fill, according to an embodiment of the present disclosure. In an embodiment, the third dielectric 130 is deposited again to fill openings and a CMP can be performed to remove overburden.

Figure 39:
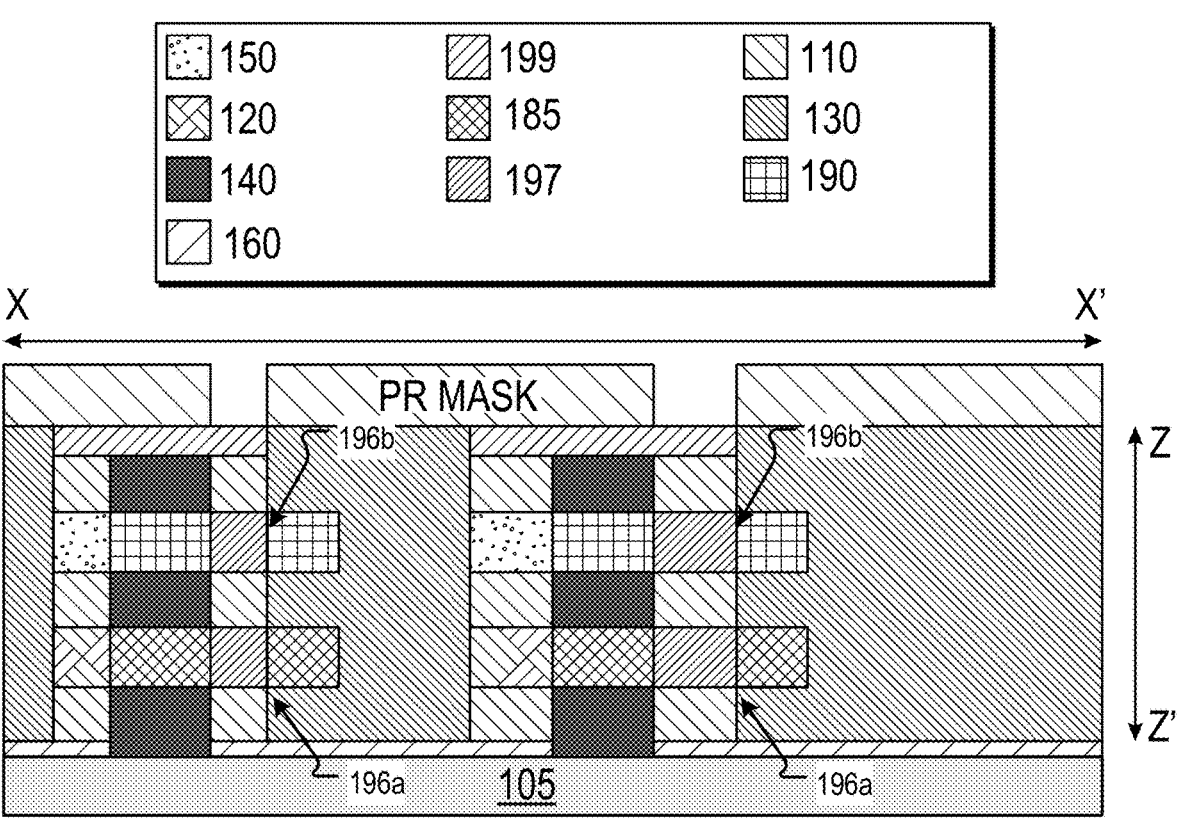
FIG. 39 is a cross-sectional substrate segment illustrating gate electrode masking and etching, according to an embodiment of the present disclosure.

FIG. 39 is a cross-sectional substrate segment illustrating gate electrode masking and etching, according to an embodiment of the present disclosure. In an embodiment, an etch mask 198 can be patterned for the gate electrode and an etch can be performed to uncover a future channel region. The first dielectric 110 in the channel region of the eventual device can then be removed.

Figure 40:
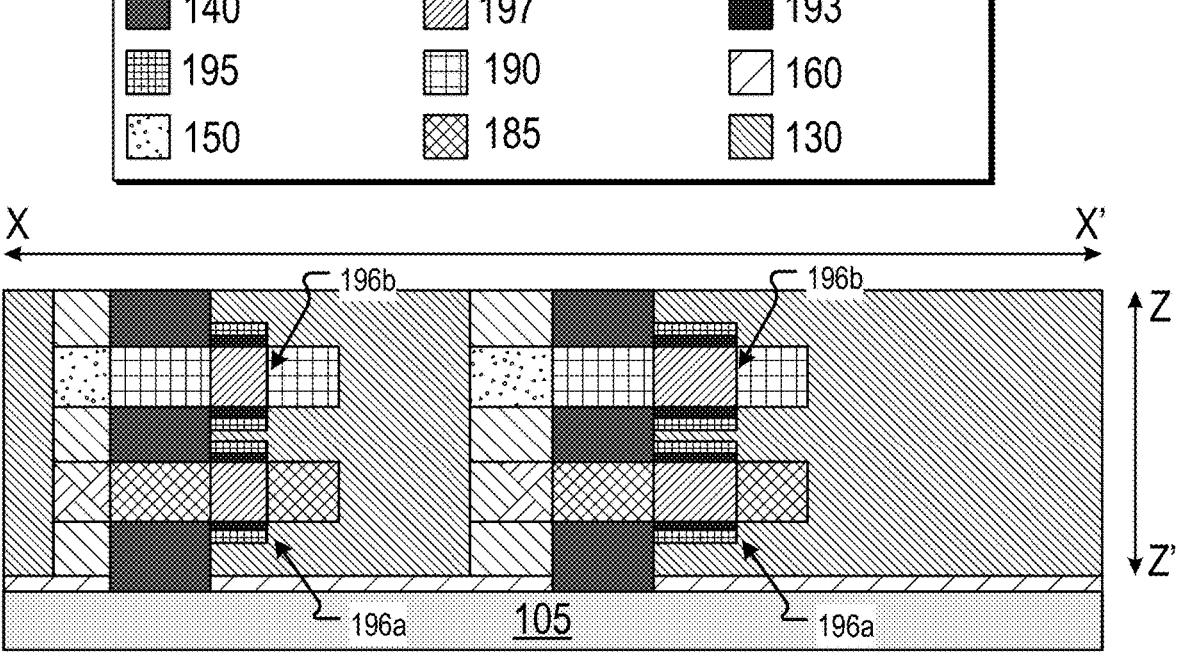
FIG. 40 is a cross-sectional substrate segment illustrating gate formation, according to an embodiment of the present disclosure.

FIG. 40 is a cross-sectional substrate segment illustrating gate formation, according to an embodiment of the present disclosure. In an embodiment, the etch mask 198 can be removed, the fill can be removed, a selective high-k material 193 can be deposited on channel regions for the gate dielectric, and a selective metal gate electrode 195 can be deposited to complete the transistors.

FIG. 41 is a flow chart for a method 4100 of fabricating a semiconductor device, according to an embodiment of the present disclosure.

In step 4105, the mixed layer stack can be formed on the surface of the substrate 105.

In step 4110, the first dielectric 110 material from the first dielectric 110 layer can be removed to uncover first interface with first epitaxial layer and form the first lateral opening.

In step 4115, the first channel structure 196a including the first channel material can be grown laterally within the first opening.

In step 4120, the second source/drain region at end of the first channel structure 196a can be grown using first channel structure 196a material as the seed material.

In step 4125, the GAA structures can be formed.

FIG. 42 is a flow chart for a method 4200 of fabricating a semiconductor device, according to an embodiment of the present disclosure.

In step 4205, the mixed layer stack can be formed on the surface of the substrate 105.

In step 4210, the first dielectric 110 material from the first dielectric 110 layer can be removed to uncover first interface with first epitaxial layer and form the first lateral opening.

In step 4215, the first channel structure 196a including the first channel material can be grown laterally within the first opening.

In step 4220, the second source/drain region at end of the first channel structure 196a can be grown using first channel structure 196a material as the seed material.

In step 4225, the second source/drain region can be covered.

In step 4230, the second dielectric 120 material from the second dielectric 120 layer can be removed to uncover the second interface and form the second lateral opening.

In step 4235, the second channel structure 196b can be grown laterally within the second opening.

In step 4240, the fourth source/drain region can be grown at the end of the second channel structure 196b using second channel structure 196b material as the seed material.

In step 4245, the GAA structures can be formed.

In an embodiment, a method of fabricating a semiconductor device, includes forming a mixed layer stack on a surface of a substrate including a semiconductor material, the mixed layer stack including a multilayer dielectric layer stack surrounding a multilayer epitaxial layer stack, the multilayer dielectric layer stack including a plurality of alternating dielectric layers alternating in a direction perpendicular to a plane of the surface of the substrate, the plurality of dielectric layers having at least two different dielectric materials having different etch selectivities to one another, a first dielectric layer of the plurality of dielectric layers comprising a first dielectric material of the at least two different dielectric materials, the first dielectric layer of the plurality of dielectric layers having a thickness corresponding to a first channel thickness, and the multilayer epitaxial layer stack surrounded by the multilayer dielectric layer stack on the surface of the substrate, the multilayer epitaxial layer stack including a plurality of alternating epitaxial layers alternating in a direction perpendicular to a plane of the surface of the substrate, the plurality of epitaxial layers having at least two different epitaxial materials having different etch selectivities to one another, a first epitaxial layer of the plurality of epitaxial layers comprising a first epitaxial material of the at least two different epitaxial materials, the first dielectric layer of the plurality of dielectric layers being substantially aligned with and forming an interface with the first epitaxial layer of the plurality of epitaxial layers along a direction parallel to the plane of the surface of the substrate; removing the first dielectric material from the first dielectric layer to uncover the interface with the first epitaxial layer and forming an opening in the multilayer dielectric layer stack, a direction of the opening being parallel with the surface of the substrate; growing a channel structure including a channel material laterally within the opening via epitaxial growth using the uncovered interface with the first epitaxial layer and the first epitaxial material as a seed material, the first epitaxial layer and the first epitaxial material at the interface comprising a first source/drain region; and growing, at an end of the channel structure opposite the first source/drain region and the interface, a second source/drain region via epitaxial growth using the end of the channel structure as the seed material.

In an embodiment, the growing the channel structure including the channel material within the opening via epitaxial growth further comprises growing the channel structure beyond a width of the first dielectric material in the first dielectric layer that was removed.

In an embodiment, the growing the channel structure including the channel material within the opening via epitaxial growth further comprises performing a directional etch to remove the channel structure grown beyond the width of the first dielectric material in the first dielectric layer that was removed to align an end of the channel structure with an edge of the multilayer dielectric layer stack, a length of the channel being the same as the width of the first dielectric material in the first dielectric layer that was removed.

In an embodiment, the growing the channel structure including the channel material within the opening via epitaxial growth further comprises performing the epitaxial growth until a predetermined length of the channel structure is reached.

In an embodiment, the growing the second source/drain region via epitaxial growth further comprises performing the epitaxial growth until a predetermined length of the second source/drain region is reached.

In an embodiment, the removing the first dielectric material from the first dielectric layer to uncover the interface with the first epitaxial layer further comprises depositing a fill around the mixed layer stack; and patterning an etch mask over top the mixed layer stack, a pattern of the etch mask covering the mixed layer stack while including an overhang on a first side of the mixed layer stack and no overhang on a second side of the mixed layer stack, the overhang configured to cover a portion of the fill adjacent to the first side of the mixed layer stack and leave the fill disposed adjacent to the first side of the mixed layer stack after the etch.

In an embodiment, the fill comprises a dielectric material having etch selectivity to the at least two different dielectric materials included in the multilayer dielectric layer stack.

In an embodiment, the method further includes depositing a dielectric fill to cover the second source/drain region, the dielectric fill comprising a dielectric material having etch selectivity to the at least two different dielectric materials included in the multilayer dielectric layer stack; patterning an etch mask over top the mixed layer stack and the dielectric fill, a pattern of the etch mask not covering portions of the mixed layer stack where the channel structure is disposed below; and removing a second dielectric material of the at least two different dielectric materials from the portions of the mixed layer stack not covered by the etch mask to uncover the channel structure.

In an embodiment, the method further comprises forming gate-all-around (GAA) structures around the channel structure to form a gate electrode via a selective high-k material deposition and a selective metal gate electrode deposition on the channel structure.

In an embodiment, the mixed layer stack includes at least five layers, at least two transistor devices are formed including the first source/drain region, the channel structure, and the second source/drain region, and the at least two transistor devices are separated by a layer comprising the second dielectric material aligned vertically with the dielectric multilayer stack and a dielectric material aligned vertically with the multilayer epitaxial layer stack, the dielectric material being etch selective to the at least two dielectric materials and the dielectric fill.

In an embodiment, a method of fabricating a semiconductor device includes forming a mixed layer stack on a surface of a substrate including a semiconductor material, the mixed layer stack including a multilayer dielectric layer stack surrounding a multilayer epitaxial layer stack, the multilayer dielectric layer stack including a plurality of alternating dielectric layers alternating in a direction perpendicular to a plane of the surface of the substrate, the plurality of dielectric layers having at least three different dielectric materials having different etch selectivities to one another, a first dielectric layer of the plurality of dielectric layers comprising a first dielectric material of the at least three different dielectric materials, the first dielectric layer of the plurality of dielectric layers having a thickness corresponding to a first channel thickness, a second dielectric layer of the plurality of dielectric layers comprising a second dielectric material of the at least three different dielectric materials, the second dielectric layer of the plurality of dielectric layers having a thickness corresponding to a second channel thickness, and the multilayer epitaxial layer stack surrounded by the multilayer dielectric layer stack on the surface of the substrate, the multilayer epitaxial layer stack including a plurality of alternating epitaxial layers alternating in a direction perpendicular to a plane of the surface of the substrate, the plurality of epitaxial layers having at least three different epitaxial materials having different etch selectivities to one another, a first epitaxial layer of the plurality of epitaxial layers comprising a first epitaxial material of the at least three different epitaxial materials, a second epitaxial layer of the plurality of epitaxial layers comprising a second epitaxial material of the at least three different epitaxial materials, the first dielectric layer of the plurality of dielectric layers being substantially aligned with and forming a first interface with the first epitaxial layer of the plurality of epitaxial layers along a direction parallel to the plane of the surface of the substrate, and the second dielectric layer of the plurality of dielectric layers being substantially aligned with and forming a second interface with the second epitaxial layer of the plurality of epitaxial layers along the direction parallel to the plane of the surface of the substrate; removing the first dielectric material from the first dielectric layer to uncover the first interface with the first epitaxial layer and forming a first opening in the multilayer dielectric layer stack, a direction of the first opening being parallel with the surface of the substrate; growing a first channel structure including a first channel material laterally within the first opening via epitaxial growth using the uncovered first interface with the first epitaxial layer and the first epitaxial material as a seed material, the first epitaxial layer and the first epitaxial material at the first interface comprising a first source/drain region; growing, at an end of the first channel structure opposite the first source/drain region and the first interface, a second source/drain region via epitaxial growth using the end of the first channel structure as the seed material; covering the second source/drain region; removing the second dielectric material from the second dielectric layer to uncover the second interface with the second epitaxial layer and forming a second opening in the multilayer dielectric layer stack, a direction of the second opening being parallel with the surface of the substrate; growing a second channel structure including a second channel material laterally within the second opening via epitaxial growth using the uncovered second interface with the second epitaxial layer and the second epitaxial material as the seed material, the second epitaxial layer and the second epitaxial material at the first interface comprising a third source/drain region; and growing, at an end of the second channel structure opposite the third source/drain region and the second interface, a fourth source/drain region via epitaxial growth using the end of the second channel structure as the seed material.

In an embodiment, the growing the first channel structure including the first channel material within the first opening via epitaxial growth further comprises growing the first channel structure beyond a width of the first dielectric material in the first dielectric layer that was removed, and the growing the second channel structure including the second channel material within the second opening via epitaxial growth further comprises growing the second channel structure beyond a width of the second dielectric material in the second dielectric layer that was removed.

In an embodiment, the growing the first channel structure including the first channel material within the first opening via epitaxial growth and the growing the second channel structure including the second channel material within the second opening via epitaxial growth further comprises performing a directional etch to remove the first channel structure and the second channel structure grown beyond the width of the first dielectric material in the first dielectric layer that was removed to align an end of the first channel structure and an end of the second channel structure with an edge of the multilayer dielectric layer stack, a length of the first channel and the length of the second channel being the same as the width of the first dielectric material in the first dielectric layer that was removed.

In an embodiment, the growing the first channel structure including the first channel material within the first opening via epitaxial growth further comprises performing the epitaxial growth until a first predetermined length of the first channel structure is reached, and the growing the second channel structure including the second channel material within the second opening via epitaxial growth further comprises performing the epitaxial growth until a second predetermined length of the second channel structure is reached.

In an embodiment, the first predetermined length of the first channel structure is different than the second predetermined length of the second channel structure.

In an embodiment, the growing the second source/drain region via epitaxial growth further comprises performing the epitaxial growth until a predetermined length of the second source/drain region is reached, and the growing the fourth source/drain region via epitaxial growth further comprises performing the epitaxial growth until a predetermined length of the fourth source/drain region is reached.

In an embodiment, the predetermined length of the second source/drain region is different than the predetermined length of the fourth source/drain region.

In an embodiment, the method further comprises depositing a dielectric fill to cover the second source/drain region and the fourth source/drain region, the dielectric fill comprising a dielectric material having etch selectivity to the at least three different dielectric materials included in the multilayer dielectric layer stack; patterning an etch mask over top the mixed layer stack and the dielectric fill, a pattern of the etch mask not covering portions of the mixed layer stack where the first channel structure and the second channel structure are disposed below; and removing a third dielectric material of the at least three different dielectric materials from the portions of the mixed layer stack not covered by the etch mask to uncover the first channel structure and the second channel structure.

In an embodiment, the method further comprises forming gate-all-around (GAA) structures around the first channel structure and the second channel structure to form a gate electrode via a selective high-k material deposition and a selective metal gate electrode deposition on the first channel structure and the second channel structure.

In an embodiment, the first epitaxial material is an N+ epitaxial material and the second epitaxial material is a P+ epitaxial material, and an NMOS transistor is formed from the N+epitaxial material and the first channel structure and a PMOS transistor is formed from the P+epitaxial material and the second channel structure.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, comprising:

forming a mixed layer stack on a surface of a substrate including a semiconductor material, the mixed layer stack including a multilayer dielectric layer stack surrounding a multilayer epitaxial layer stack, the multilayer dielectric layer stack including a plurality of alternating dielectric layers alternating in a direction perpendicular to a plane of the surface of the substrate, the plurality of dielectric layers having at least two different dielectric materials having different etch selectivities to one another, a first dielectric layer of the plurality of dielectric layers comprising a first dielectric material of the at least two different dielectric materials, the first dielectric layer of the plurality of dielectric layers having a thickness corresponding to a first channel thickness, and the multilayer epitaxial layer stack surrounded by the multilayer dielectric layer stack on the surface of the substrate, the multilayer epitaxial layer stack including a plurality of alternating epitaxial layers alternating in the direction perpendicular to the plane of the surface of the substrate, the plurality of epitaxial layers having at least two different epitaxial materials having different etch selectivities to one another, a first epitaxial layer of the plurality of epitaxial layers comprising a first epitaxial material of the at least two different epitaxial materials, the first dielectric layer of the plurality of dielectric layers being substantially aligned with and forming an interface with the first epitaxial layer of the plurality of epitaxial layers along the direction parallel to the plane of the surface of the substrate;

removing the first dielectric material from the first dielectric layer to uncover the interface with the first epitaxial layer and forming an opening in the multilayer dielectric layer stack, a direction of the opening being parallel with the surface of the substrate;

growing a channel structure including a channel material laterally within the opening via epitaxial growth using the uncovered interface with the first epitaxial layer and the first epitaxial material as a seed material, the first epitaxial layer and the first epitaxial material at the interface comprising a first source/drain region; and growing, at an end of the channel structure opposite the first source/drain region and the interface, a second source/drain region via epitaxial growth using the end of the channel structure as the seed material.

2. The method of claim 1, wherein the growing the channel structure including the channel material within the opening via epitaxial growth further comprises growing the channel structure beyond a width of the first dielectric material in the first dielectric layer that was removed.

3. The method of claim 2, wherein the growing the channel structure including the channel material within the opening via epitaxial growth further comprises performing a directional etch to remove the channel structure grown beyond the width of the first dielectric material in the first dielectric layer that was removed to align an end of the channel structure with an edge of the multilayer dielectric layer stack, a length of the channel being the same as the width of the first dielectric material in the first dielectric layer that was removed.

4. The method of claim 2, wherein the growing the channel structure including the channel material within the opening via epitaxial growth further comprises performing the epitaxial growth until a predetermined length of the channel structure is reached.

5. The method of claim 1, wherein the growing the second source/drain region via epitaxial growth further comprises performing the epitaxial growth until a predetermined length of the second source/drain region is reached.

6. The method of claim 1, wherein the removing the first dielectric material from the first dielectric layer to uncover the interface with the first epitaxial layer further comprises depositing a fill around the mixed layer stack; and patterning an etch mask over top the mixed layer stack, a pattern of the etch mask covering the mixed layer stack while including an overhang on a first side of the mixed layer stack and no overhang on a second side of the mixed layer stack, the overhang configured to cover a portion of the fill adjacent to the first side of the mixed layer stack and leave the fill disposed adjacent to the first side of the mixed layer stack after the etch.

7. The method of claim 6, wherein the fill comprises a dielectric material having etch selectivity to the at least two different dielectric materials included in the multilayer dielectric layer stack.

8. The method of claim 1, further comprising depositing a dielectric fill to cover the second source/drain region, the dielectric fill comprising a dielectric material having etch selectivity to the at least two different dielectric materials included in the multilayer dielectric layer stack;

patterning an etch mask over top the mixed layer stack and the dielectric fill, a pattern of the etch mask not covering portions of the mixed layer stack where the channel structure is disposed below; and removing a second dielectric material of the at least two different dielectric materials from the portions of the mixed layer stack not covered by the etch mask to uncover the channel structure.

9. The method of claim 8, further comprising forming gate-all-around (GAA) structures around the channel structure to form a gate electrode via a selective high-k material deposition and a selective metal gate electrode deposition on the channel structure.

10. The method of claim 9, wherein the mixed layer stack includes at least five layers, at least two transistor devices are formed including the first source/drain region, the channel structure, and the second source/drain region, and the at least two transistor devices are separated by a layer comprising the second dielectric material aligned vertically with the dielectric multilayer stack and a dielectric material aligned vertically with the multilayer epitaxial layer stack, the dielectric material being etch selective to the at least two dielectric materials and the dielectric fill.

* * * * *